United States Patent
Lee et al.

(10) Patent No.: US 11,081,171 B2
(45) Date of Patent: Aug. 3, 2021

(54) NONVOLATILE MEMORY DEVICE INCLUDING A FAST READ PAGE AND A STORAGE DEVICE INCLUDING THE SAME

(71) Applicant: SAMSUNG ELECTRONICS CO., LTD., Suwon-si (KR)

(72) Inventors: Yunjung Lee, Suwon-si (KR); Chanha Kim, Hwaseong-si (KR); Kangho Roh, Seoul (KR); Heewon Lee, Seoul (KR)

(73) Assignee: SAMSUNG ELECTRONICS CO., LTD., Suwon-si (KR)

(*) Notice: Subject to any disclaimer, the term of this patent is extended or adjusted under 35 U.S.C. 154(b) by 0 days.

(21) Appl. No.: 16/838,078

(22) Filed: Apr. 2, 2020

(65) Prior Publication Data

US 2021/0057025 A1 Feb. 25, 2021

(30) Foreign Application Priority Data

Aug. 21, 2019 (KR) .................. 10-2019-0102178

(51) Int. Cl.
*G11C 11/56* (2006.01)
*G11C 16/04* (2006.01)
*G11C 16/10* (2006.01)
*G11C 16/26* (2006.01)

(52) U.S. Cl.
CPC ...... *G11C 11/5671* (2013.01); *G11C 16/0483* (2013.01); *G11C 16/10* (2013.01); *G11C 16/26* (2013.01); *G11C 2216/14* (2013.01)

(58) Field of Classification Search
CPC . G11C 11/5671; G11C 16/0483; G11C 16/10; G11C 16/26; G11C 2216/14
See application file for complete search history.

(56) References Cited

U.S. PATENT DOCUMENTS

| 6,441,425 | B1 | 8/2002 | Suzuki |
| 7,339,823 | B2 | 3/2008 | Nakayama et al. |
| 7,724,587 | B2 | 5/2010 | Song et al. |
| 8,050,115 | B2 | 11/2011 | Kang et al. |
| 8,149,607 | B2 | 4/2012 | Scheuerlein et al. |
| 8,446,773 | B2* | 5/2013 | Lee .................. G11C 11/5642 365/185.18 |
| 10,254,977 | B2 | 4/2019 | Ramalingam et al. |
| 10,541,033 | B2* | 1/2020 | Jung .................. G11C 16/20 |
| 2011/0194347 | A1 | 8/2011 | Chae |
| 2013/0097364 | A1 | 4/2013 | Cho et al. |
| 2016/0125951 | A1 | 5/2016 | Sun et al. |
| 2016/0148695 | A1* | 5/2016 | Kim .................. G11C 29/42 365/185.03 |
| 2021/0020254 | A1* | 1/2021 | Kim .................. G11C 7/1057 |

FOREIGN PATENT DOCUMENTS

JP 2007-157234 6/2007

* cited by examiner

*Primary Examiner* — Gene N Auduong
(74) *Attorney, Agent, or Firm* — F. Chau & Associates, LLC

(57) ABSTRACT

A nonvolatile memory device including: a memory cell array, the memory cell array including a plurality of cell strings, at least one of the cell strings including a plurality of memory cells stacked in a direction perpendicular to a surface of a substrate, at least one of the memory cells is a multi-level cell storing at least three bits; and a control logic circuit configured to control a page buffer to read a fast read page of the memory cells with one read voltage and at least two normal read pages of the memory cells with the same number of read voltages.

25 Claims, 23 Drawing Sheets

FIG. 18

| Bit/Cell | Fast Read Page | Normal Read Page |
|---|---|---|
| 3 | 1 | 3.0 |
| 4 | 1 | 4.7 |
| 5 | 1 | 7.5 |
| 6 | 1 | 12.4 | vs

| SLC Page | Legacy Page |
|---|---|
| 1 | 2.3 |
| 1 | 3.8 |
| 1 | 6.2 |
| 1 | 10.5 |

FIG. 19A

| Bit/Cell | Fast Read Page | Normal Read Page |
|---|---|---|
| 3 | 26 | 78 |
| 4 | 26 | 121 |
| 5 | 26 | 195 |
| 6 | 26 | 322 | vs

| SLC Page | Legacy Page |
|---|---|
| 26 | 61 |
| 26 | 98 |
| 26 | 161 |
| 26 | 273 |

NONVOLATILE MEMORY DEVICE INCLUDING A FAST READ PAGE AND A STORAGE DEVICE INCLUDING THE SAME

CROSS-REFERENCE TO RELATED APPLICATION

This application claims priority under 35 U.S.C. § 119 to Korean Patent Application No. 10-2019-0102178 filed on Aug. 21, 2019, in the Korean Intellectual Property Office, the disclosure of which is incorporated by reference herein in its entirety.

TECHNICAL FIELD

The inventive concept relates to a nonvolatile memory device.

DISCUSSION OF RELATED ART

Semiconductor memories may be classified as volatile memory devices or nonvolatile memory devices. Volatile memory devices lose data stored therein in the absence of power. Examples of volatile memory devices include a static random access memory (SRAM), a dynamic RAM (DRAM), and a synchronous DRAM (SDRAM). Nonvolatile memory devices retain data stored therein even in the absence of power. Examples on nonvolatile memory devices include a read only memory (ROM), a programmable ROM (PROM), an electrically programmable ROM (EPROM), an electrically erasable and programmable ROM (EEPROM), a flash memory device, a phase-change RAM (PRAM), a magnetic RAM (MRAM), a resistive RAM (RRAM), and a ferroelectric RAM (FRAM).

Various program techniques are used to increase the number of data bits to be stored per memory cell. However, certain data is required to be programmed in a single level cell (SLC) program scheme to maintain its reliability. However, when performing SLC programming on an entire memory block, even though data reliability is secured, there is a loss of storage space.

SUMMARY

An exemplary embodiment of the inventive concept provides a nonvolatile memory device comprising: a memory cell array, the memory cell array including a plurality of cell strings, at least one of the cell strings including a plurality of memory cells stacked in a direction perpendicular to a surface of a substrate, at least one of the memory cells is a multi-level cell storing at least three bits; and a control logic circuit configured to control a page buffer to read a fast read page of the memory cells with one read voltage and at least two normal read pages of the memory cells with the same number of read voltages.

An exemplary embodiment of the inventive concept provides an operating method of a storage device including a memory controller and a nonvolatile memory device, the method comprising: receiving a command for reading data from a fast read page of the nonvolatile memory device; and providing the data read from the fast read page to the memory controller through a data line, wherein the fast read page is read with one read voltage, wherein the nonvolatile memory device includes a plurality of cell strings, at least one of the cell strings including a plurality of memory cells stacked in a direction perpendicular to a surface of a substrate, at least one of the memory cells is a multi-level cell storing at least three bits.

An exemplary embodiment of the inventive concept provides a storage system comprising: a storage device that exchanges a signal with an external device, wherein the storage device includes a memory controller and a plurality of nonvolatile memories, wherein at least one of the memories includes: a memory cell array, the memory cell array including a plurality of memory cells stacked in a direction perpendicular to a surface of a substrate; and a control logic circuit configured to control a page buffer to read a fast read page of the memory cells with one read voltage and at least two normal read pages of the memory cells with the same number of read voltages.

An exemplary embodiment of the inventive concept provides a memory device comprising: a memory controller, and a nonvolatile memory device connected to the memory controller, wherein the memory controller is configured to perform a read operation on the nonvolatile memory device such that a fast read page of the nonvolatile memory device is read with one read voltage and at least two normal read pages of the nonvolatile memory device are read with the same number of read voltages.

BRIEF DESCRIPTION OF THE DRAWINGS

The above and other features of the inventive concept will become more apparent by describing in detail exemplary embodiments thereof with reference to the accompanying drawings.

FIG. 18 is a table illustrating the average number of read voltages required to determine page data depending on a page type.

FIG. 19A is a table illustrating a read time taken to determine page data depending on a page type.

DETAILED DESCRIPTION OF THE EMBODIMENTS

Figure 1:
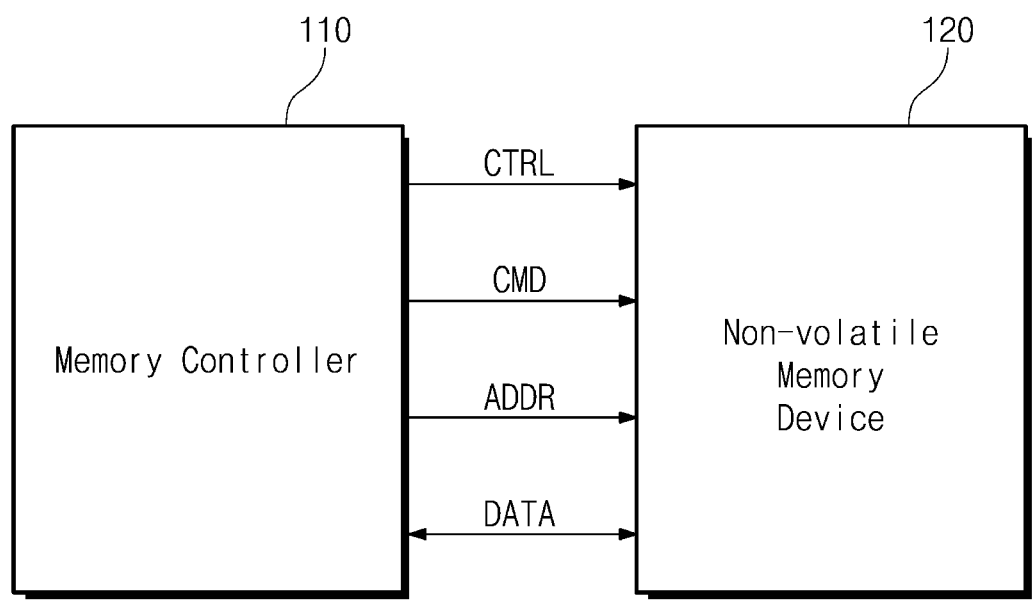
FIG. 1 illustrates a storage device according to an exemplary embodiment of the present inventive concept.

Below, exemplary embodiments of the inventive concept will be described in detail with reference to the accompanying drawings. Like reference numerals may refer to like elements in the drawings.

Hereinafter, components that are described with reference to the terms "unit", "module", "block", etc. and function blocks illustrated in drawings may be implemented with software, hardware, or a combination thereof. For example, the software may be machine code, firmware, embedded code, or application software. For example, the hardware may include an electrical circuit, an electronic circuit, a processor, a computer, an integrated circuit, integrated circuit cores, a pressure sensor, an inertial sensor, a microelectromechanical system (MEMS), a passive element, or a combination thereof.

FIG. 1 illustrates a storage device 100 according to an exemplary embodiment of the present inventive concept.

The storage device 100 includes a memory controller 110 and a nonvolatile memory device 120. For example, the nonvolatile memory device 120 may include a plurality of nonvolatile memories. The nonvolatile memories may be connected to the memory controller 110 through a plurality of channels. In this case, at least two or more nonvolatile memories may be connected to each channel.

The memory controller 110 may control a read operation and a write operation of the nonvolatile memory device 120. For example, the memory controller 110 may transfer a command CMD, an address ADDR, and data "DATA" to the nonvolatile memory device 120 by using a plurality of data signals DQ. Alternatively, by using the plurality of data signals DQ, the memory controller 110 transfers the command CMD and the address ADDR to the nonvolatile memory device 120 and receives the data "DATA" from the nonvolatile memory device 120. The memory controller 110 transfers control signals CTRL and a data strobe signal DQS to the nonvolatile memory device 120.

In an exemplary embodiment of the inventive concept, the control signals CTRL, the data strobe signal DQS, and the plurality of data signals DQ may be transferred to the nonvolatile memory device 120 through different signal lines, independently of each other. The control signals CTRL and the data strobe signal DQS may be used to identify the plurality of data signals DQ that are transferred from the memory controller 110 to the nonvolatile memory device 120. Alternatively, the control signals CTRL and the data strobe signal DQS may be used to identify the plurality of data signals DQ that are exchanged between the memory controller 110 and the nonvolatile memory device 120.

In response to the received signals, the nonvolatile memory device 120 may receive the data "DATA" from the memory controller 110 or may transfer the data "DATA" to the memory controller 110. For example, the nonvolatile memory device 120 may identify the command CMD, the address ADDR, or the data "DATA" of the plurality of data signals DQ by using the control signals CTRL.

In an exemplary embodiment of the inventive concept, the nonvolatile memory device 120 may include a NAND flash memory. However, the inventive concept is not limited thereto. For example, the nonvolatile memory device 120 may include at least one of volatile or nonvolatile memories such as a static random access memory (SRAM), a dynamic RAM (DRAM), a synchronous DRAM (SDRAM), a read only memory (ROM), a programmable ROM (PROM), an electrically programmable ROM (EPROM), an electrically erasable and programmable ROM (EEPROM), a flash memory, a phase-change RAM (PRAM), a magnetic RAM (MRAM), a resistive RAM (RRAM), a ferroelectric RAM (FRAM), and the like.

Figure 2:
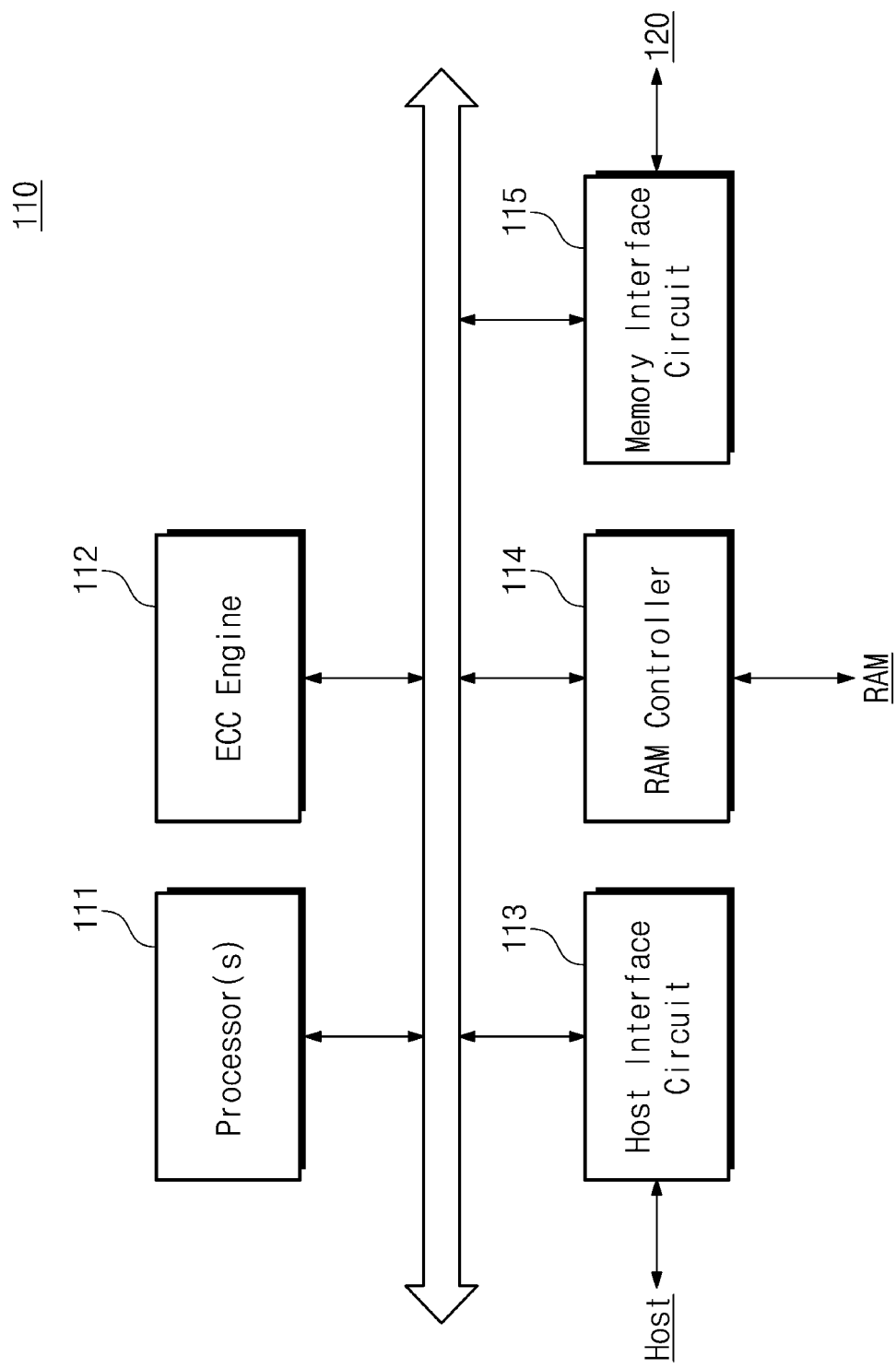
FIG. 2 illustrates a memory controller illustrated in FIG. 1.

FIG. 2 illustrates a memory controller illustrated in FIG. 1.

The memory controller 110 includes at least one processor 111, an error check and correction engine 112, a host interface circuit 113, a RAM controller 114, and a nonvolatile memory interface circuit 115.

The processor 111 may control overall operations of the memory controller 110. The processor 111 may drive various firmware/software to control the nonvolatile memory device 120. For example, the processor 111 may drive a flash translation layer for managing a mapping table in which a relationship between logical addresses of a host device and physical addresses of the nonvolatile memory device 120 is defined.

The ECC engine 112 may generate an error correction code for write data to be stored in the nonvolatile memory device 120. The ECC engine 112 may detect and correct an error of read data based on an error correction code read from the nonvolatile memory device 120.

The host interface circuit 113 may perform communication with the host device by using a bus having various communication protocols. For example, a format of the bus may include one or more of various interface protocols such as universal serial bus (USB), small computer system interface (SCSI), peripheral component interconnect express (PCIe), mobile PCIe (M-PCIe), advanced technology attachment (ATA), parallel ATA (PATA), serial ATA (SATA), serial attached small computer system interface (SCSI) (SAS), integrated drive electronics (IDE), enhanced IDE (EIDE), nonvolatile memory express (NVMe), and universal flash storage (UFS).

The RAM controller 114 may provide interfacing between the memory controller 110 and a RAM. The RAM controller 114 may access the RAM in response to a request of the processor 111 or any other intellectual property (IP). For example, the RAM controller 114 may record data at the RAM depending on a write request of the processor 111. Alternatively, the RAM controller 114 may read data from the RAM depending on a read request of the processor 111.

The nonvolatile memory interface circuit 115 may perform communication with the nonvolatile memory device 120.

Figure 3:
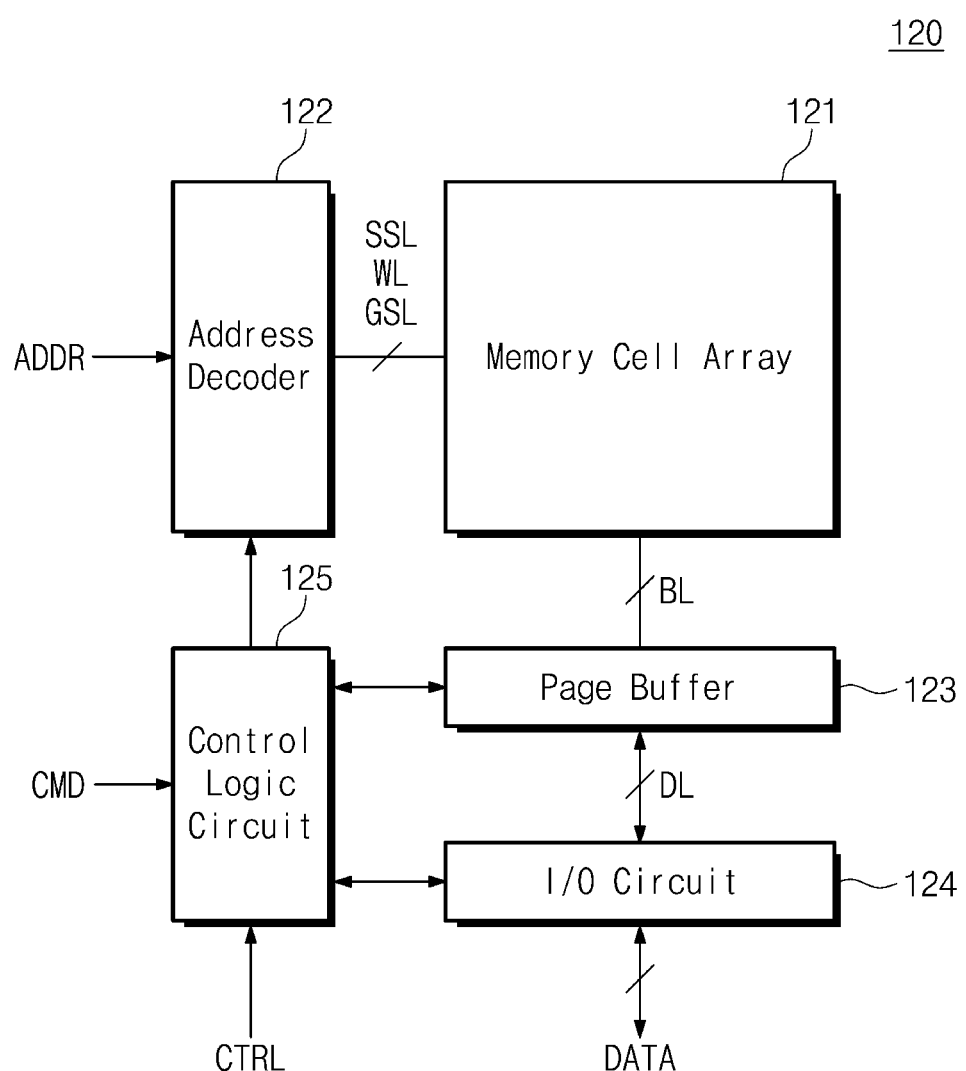
FIG. 3 illustrates a nonvolatile memory device of FIG. 1.

FIG. 3 illustrates a nonvolatile memory device of FIG. 1. The nonvolatile memory device 120 may include a memory cell array 121, an address decoder 122, a page buffer 123, an input/output circuit 124, and a control logic circuit 125.

The memory cell array 121 may include the plurality of memory blocks BLK1 to BLKm. Each of the memory blocks BLK1 to BLKm may include a plurality of cell strings. Each of the cell strings includes a plurality of memory cells. The plurality of memory cells may be connected to a plurality of word lines WL. Each of the memory cells may include a single level cell (SLC) storing one bit or a multi-level cell (MLC) storing at least two bits.

The address decoder 122 is connected to the memory cell array 121 through the plurality of word lines WL, string selection lines SSL, and ground selection lines GSL. The address decoder 122 may receive a logical address and may decode the received logical address to drive the plurality of word lines WL. For example, the address ADDR may indicate a physical address that is obtained by translating a logical address. This translation operation may be performed by the flash translation layer (FTL) that is driven by the memory controller 110 (refer to FIG. 1), for example.

The page buffer 123 is connected to the memory cell array 121 through a plurality of bit lines BL. Under control of the control logic circuit 125, the page buffer 123 may control the bit lines BL such that the data "DATA" received from the input/output circuit 124 are stored in the memory cell array 121. Under control of the control logic circuit 125, the page buffer 123 may read data stored in the memory cell array 121 and may transfer the read data to the input/output circuit 124. The page buffer 123 may receive data from the input/output circuit 124 in the unit of page or may read data from the memory cell array 121 in the unit of page.

The input/output circuit 124 may receive the data "DATA" from the outside and may provide the received data "DATA" to the page buffer 123.

The control logic circuit 125 may receive the command CMD and the control signals CTRL from the outside and may control the address decoder 122, the page buffer 123, and the input/output circuit 124 in response to the received command and control signals CMD and CTRL. For example, the control logic circuit 125 may control other components in response to the command and control signals CMD and CTRL such that the data "DATA" are stored in the memory cell array 121. Alternatively, the control logic circuit 125 may control other components in response to the command and control signals CMD and CTRL such that the data "DATA" stored in the memory cell array 121 are transferred to the outside. The control signals CTRL may include signals that the memory controller 110 provides to control the nonvolatile memory device 120.

The control logic circuit 125 may generate various voltages used by the nonvolatile memory device 120 to operate. For example, the control logic circuit 125 may generate a plurality of program voltages, a plurality of pass voltages, a plurality of selection read voltages, a plurality of non-selection read voltages, a plurality of erase voltages, a plurality of verify voltages, etc. The control logic circuit 125 may provide the generated voltages to the address decoder 122 or to a substrate of the memory cell array 121.

Figure 4:
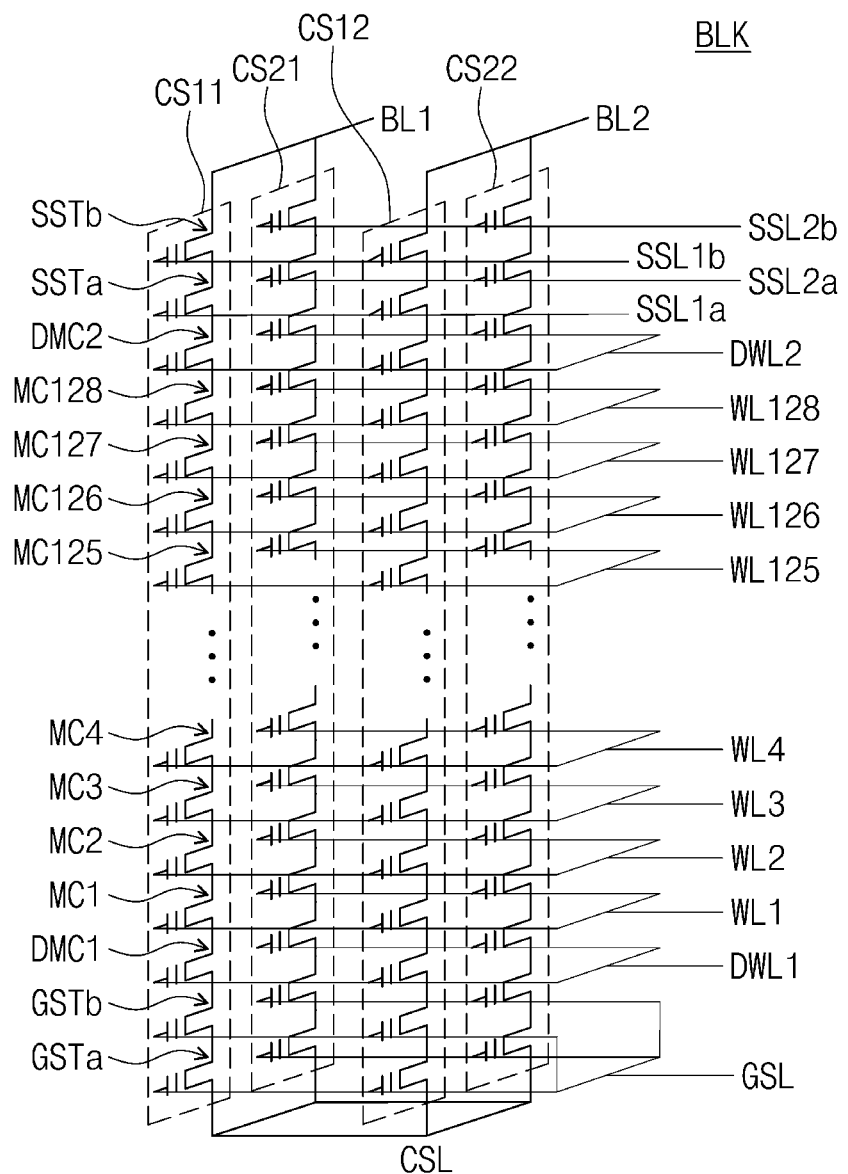
FIG. 4 is a circuit diagram illustrating a memory block BLK of a plurality of memory blocks included in a memory cell array of FIG. 3.
Figure 4:
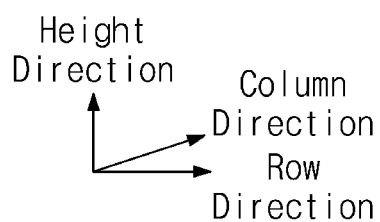

FIG. 4 is a circuit diagram illustrating a memory block BLK of a plurality of memory blocks included in a memory cell array of FIG. 3.

The memory block BLK includes a plurality of cell strings CS11, CS12, CS21, and CS22. The plurality of cell strings CS11, CS12, CS21, and CS22 may be arranged in a row direction and a column direction to form rows and columns.

Each of the plurality of cell strings CS11, CS12, CS21, and CS22 includes a plurality of cell transistors. For example, each of the plurality of cell strings CS11, CS12, CS21, and CS22 may include string selection transistor SSTa and SSTb, a plurality of memory cells MC1 to MC128, ground selection transistors GSTa and GSTb, and dummy memory cells DMC and DMC2. The cell transistors may be stacked in a height direction that is a direction perpendicular to a plane defined by the row direction and the column direction. Each of the cell transistors may be a charge trap flash (CTF) memory cell.

In each of the cell strings CS11, CS12, CS21, and CS22, the plurality of memory cells MC1 to MC128 are connected in series. The string selection transistors SSTa and SSTb are connected in series. The serially-connected string selection transistors SSTa and SST are provided between a bit line BL1 or BL2 and the serially-connected memory cells MC1 to MC128. The ground selection transistors GSTa and GSTb are connected in series. The serially-connected ground selection transistors GSTa and GSTb are provided between the serially-connected memory cells MC1 to MC128 and a common source line CSL. The first dummy memory cell DMC1 is provided between the serially-connected memory cells MC1 to MC128 and the serially-connected ground selection transistors GSTa and GSTb. The second dummy memory cell DMC2 is provided between the serially-connected string selection transistors SSTa and SSTb and the serially-connected memory cells MC1 to MC128.

The ground selection transistors GSTa and GSTb may be connected in common to a ground selection line GSL. Alternatively, ground selection transistors of the same row may be connected to the same ground selection line. For example, the first ground selection transistors GSTa of the cell strings CS11 and CS12 in the first row may be connected to a first ground selection line, and the first ground selection transistors GSTa of the cell strings CS21 and CS22 in the second row may be connected to a second ground selection line. Alternatively, ground selection transistors that are provided at the same height from a substrate may be connected to the same ground selection line. For example, the first ground selection transistors GSTa of the cell strings CS11, CS12, CS21, and CS22 may be connected to the first ground selection line, and the second ground selection transistors GSTb of the cell strings CS11, CS12, CS21, and CS22 may be connected to the second ground selection line.

Memory cells of the same height from the substrate (or the ground selection transistors GSTa and GSTb) are connected in common to the same word line. In addition, memory cells arranged at different heights from the substrate (or the ground selection transistors GSTa and GSTb) may be connected to different word lines. For example, the memory cells MC1 to MC128 of the cell strings CS11, CS12, CS21, and CS22 are connected to word lines WL1 to WL128.

String selection transistors, which belong to the same row, from among the first string selection transistors SSTa of the same height are connected to the same string selection line. For example, the first string selection transistors SSTa of the cell strings CS11 and CS12 in the first row are connected in common to a string selection line SSL1a, and the first string selection transistors SSTa of the cell strings CS21 and CS22 in the second row are connected in common to a string selection line SSL2a.

Likewise, string selection transistors, which belong to the same row, from among the second string selection transistors SSTb of the same height are connected to the same string selection line. For example, the second string selection transistors SSTb of the cell strings CS11 and CS12 in the first row are connected in common to a string selection line SSL1b, and the second string selection transistors SSTb of the cell strings CS21 and CS22 in the second row are connected in common to a string selection line SSL2b.

Dummy memory cells of the same height are connected to the same dummy word line. For example, the first dummy memory cells DMC1 are connected to a first dummy word line DWL1, and the second dummy memory cells DMC2 are connected to a second dummy word line DWL2.

In the memory block BLK, read and write operations may be performed in the unit of a row. For example, a row of the memory block BLK may be selected by the string selection lines SSL1a, SSL1b, SSL2a, and SSL2b.

When a turn-on voltage is supplied to the string selection lines SSL1a and SSL1b and a turn-off voltage is supplied to the string selection lines SSL2a and SSL2b, the cell strings CS11 and CS12 in a first row are connected to the bit lines BL1 and BL2, respectively. When the turn-on voltage is supplied to the string selection lines SSL2a and SSL2b and the turn-off voltage is supplied to the string selection lines SSL1a and SSL1b, the cell strings CS21 and CS22 in the second row are respectively connected to the bit lines BL1 and BL2. As a word line is driven, memory cells (having the same height) connected to the driven word line from among the memory cells MC1 to MC128 of the cell strings CS11 to CS22 are selected. A read/write operation may be performed on the selected memory cells. The selected memory cells may constitute a page unit.

For example, in the case where each of the memory cells MC1 to MC128 is a triple level cell (TLC) storing 3-bit data, memory cells connected to one word line may store three pages. Three pages that are stored in memory cells connected to one word line may include a least significant bit (LSB) page, a center significant bit (CSB) page, and a most significant bit (MSB) page. However, the inventive concept is not limited thereto. For example, each memory cell may be implemented with a quad level cell (QLC) storing 4-bit data or any other type of memory cell storing five or more data bits. For example, each memory cell may be implemented with a penta level cell (PLC) storing 5-bit data or a hexa level cell (HLC) storing 6-bit data.

Additionally, according to an exemplary embodiment of the present inventive concept, pages of memory cells connected to a selected word line include a fast read page and a normal read page. The fast read page refers to a page in which data are determined by one read voltage. In other words, only one read voltage may be used to determine data of the fast read page. The normal read page refers to a page in which data are determined by a plurality of read voltages. In other words, more than one read voltage is used to determine data of the normal read page. In the case that one of the pages of the memory cells connected to a selected word line is programmed to be the fast read page, both SLC programming and MLC programming (or QLC programming) may be performed on the pages of the memory cells connected to the selected word line. This will be described later.

In the memory block BLK, an erase operation may be performed for each memory block or for each sub-block. When an erase operation is performed for each memory block, all the memory cells MC1 to MC128 of the memory block BLK may be simultaneously erased according to one erase request. When the erase operation is performed for each sub-block, some of the memory cells MC1 to MC128 of the memory block BLK may be simultaneously erased according to one erase request, and the remaining memory cells of the memory block BLK may be erase-inhibited. A low voltage (e.g., a ground voltage) may be supplied to a word line connected to memory cells to be erased, and a word line connected to erase-inhibited memory cells may be floated.

It is to be understood that the memory block BLK illustrated in FIG. 4 is merely exemplary. The number of cell strings, the number of rows of cell strings, and the number of columns of cell strings may be variable. In addition, in the memory block BLK, the number of string selection transistors, the number of dummy memory cells, the number of memory cells, and/or the number of ground selection transistors may increase or decrease, and the height of the memory block BLK may increase or decrease depending on the number of cell transistors. In addition, the number of string selection lines, the number of dummy word lines, the number of word lines, and/or the number of ground selection lines may vary depending on the number of string selection transistors, the number of dummy memory cells, the number of memory cells, and/or the number of ground selection transistors.

Figure 5:
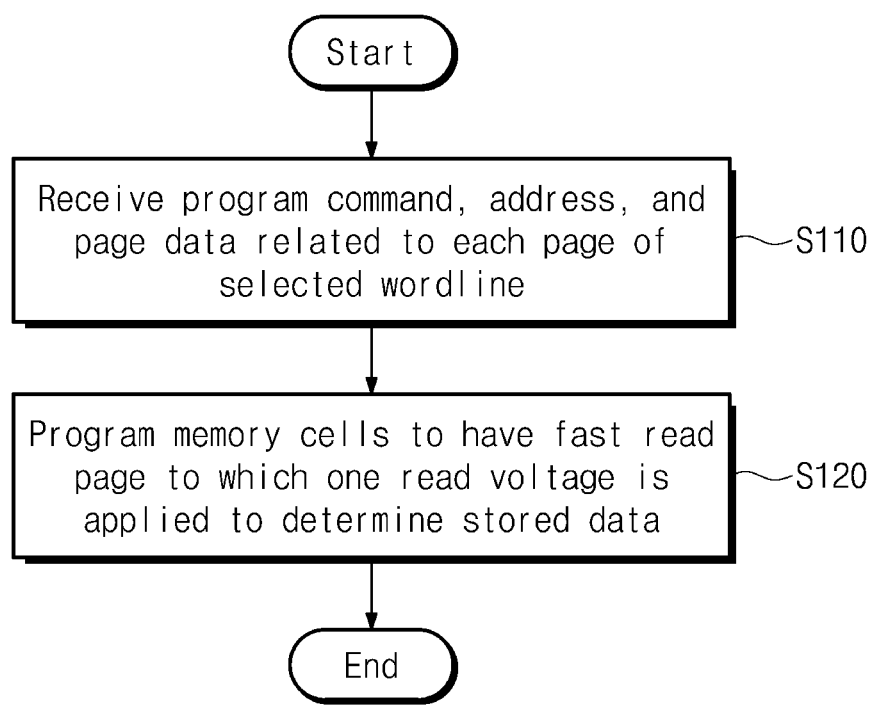
FIG. 5 illustrates an operating method of a storage device according to an exemplary embodiment of the present inventive concept.

FIG. 5 illustrates an operating method of a storage device according to an exemplary embodiment of the present inventive concept. A method in which an SLC program operation and a TLC program operation are performed together on memory cells connected to a selected word line will be described with reference to FIGS. 1, 3, and 5.

In operation S110, the nonvolatile memory device 120 receives a program command, an address, and page data associated with each page of a selected word line from the memory controller 110. For example, in the case where the TLC program operation is performed on the nonvolatile memory device 120, a program command, an address, and page data may be repeatedly received three times. In the case where the QLC program operation is performed on the nonvolatile memory device 120, a program command, an address, and page data may be repeatedly received four times.

In operation S120, based on the program command, the address, and the page data received from the memory controller 110, memory cells connected to the selected word line are programmed to have a fast read page. The fast read page may be a page in which data are determined by one read voltage. To accomplish this, a special bit ordering may be used. For example, data including continuous bits of "1" and continuous bits of "0" may be stored in the fast read page. In other words, the data may have one transition from bit "1" to bit "0" (or from bit "0" to bit "1"). More specifically, the data of the fast read page may have just one bit transition.

Data of each normal read page may be composed of a combination of bit "1" and bit "0". However, as the number of data bits to be stored in each memory cell increases, the number of transitions from bit "1" to bit "0" (or from bit "0" to bit "1") may increase. Hereinafter, a transition from bit "1" to bit "0" or from bit "0" to bit "1" may be referred to as a "bit transition." In an exemplary embodiment of the inventive concept, the number of bit transitions of data of each normal read page (or the number of periods in each of which bit "1" and bit "0" of data of each normal read page are switched) may be mostly identical. In particular, data of at least two of normal read pages other than a fast read page may include the same number of bit transitions. For example, a first normal read page and a second normal read page may each have four bit transitions.

Figure 6:
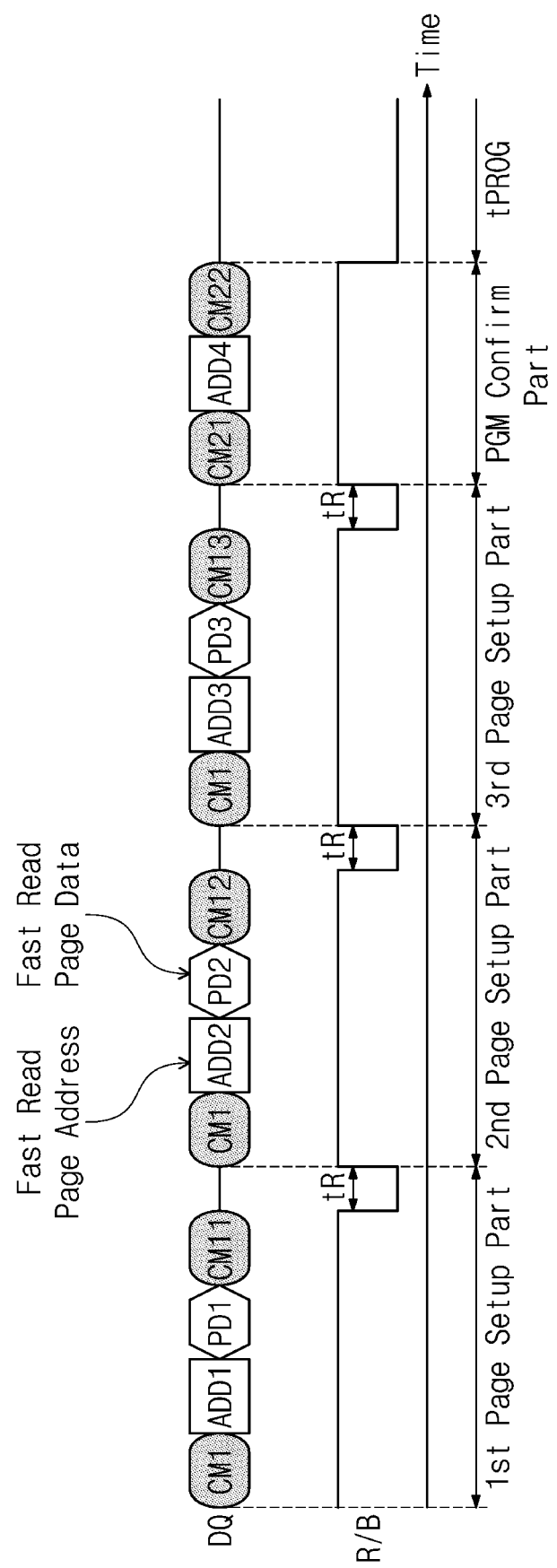
FIG. 6 is a timing diagram for describing an operating method of a storage device of FIG. 5.

FIG. 6 is a timing diagram for describing an operating method of a storage device described with reference to FIG. 5.

Referring to FIGS. 1, 5, and 6, the nonvolatile memory device 120 may receive first page data PD1, second page data PD2, and third page data PD3 from the memory controller 110.

During a first page setup part, the nonvolatile memory device 120 may receive a command CM1, a first address ADD1, the first page data PD1, and a command CM11 through a data line. The data line may be connected between the nonvolatile memory device 120 and the memory controller 110. The commands CM1 and CM11 may be a command set for setting up the first page data PD1. The first address ADD may correspond to an area of memory cells, in which the first page data PD1 are to be programmed, from among memory cells connected to a selected word line. The nonvolatile memory device 120 may dump the first page data PD1 received through the data line in response to the command CM11. A busy signal R/B may be in a busy state while the first page data PD1 are dumped. In FIG. 6, tR may correspond to a read access cycle time.

During a second page setup part, the nonvolatile memory device 120 may receive the command CM1, a second address ADD2, the second page data PD2, and a command CM12. The commands CM1 and CM12 may be a command set for setting up the second page data PD2. The second address ADD2 may correspond to an area of memory cells, in which the second page data PD2 are to be programmed, from among the memory cells connected to the selected word line. The nonvolatile memory device 120 may dump the second page data PD2 received through the data line in response to the command CM12. The busy signal R/B may be in a busy state while the second page data PD2 are dumped.

During a third page setup part, the nonvolatile memory device 120 may receive the command CM1, a third address ADD3, the third page data PD3, and a command CM13. The commands CM1 and CM13 may be a command set for setting up the third page data PD3. The third address ADD3 may correspond to an area of memory cells, in which the third page data PD3 are to be programmed, from among the memory cells connected to the selected word line. The nonvolatile memory device 120 may dump the third page data PD3 received through the data line in response to the command CM13. The busy signal R/B may be in a busy state while the third page data PD3 are dumped.

Afterwards, in a program confirm part, the nonvolatile memory device 120 may receive a command CM21, a fourth address ADD4, and a command CM22. The commands CM21 and CM22 may be a program confirm command set for initiating a program operation. In an exemplary embodiment of the inventive concept, the fourth address ADD4 may include information about a program order.

The nonvolatile memory device 120 may perform a program operation on the received page data PD1, PD2, and PD3 during a program time tPROG, in response to the command CM22. During the program time tPROG, the busy signal R/B may be in a busy state (e.g., in a low state).

As described above, the nonvolatile memory device 120 may continuously or sequentially receive a plurality of page data corresponding to one selected word line and may perform a program operation after the plurality of page data are completely received. However, the inventive concept is not limited thereto. In the case where the number of data bits to be stored per memory cell exceeds "3", the number of page setup parts in which a command, an address, and page data are received may increase as much as the number of data bits has increased.

In an exemplary embodiment of the inventive concept, one of the first to third page setup parts may correspond to a fast read page. For example, in the case where the second page setup part corresponds to a fast read page, the second address ADD2 may indicate an address of an SLC page where the second page data PD2 are programmed. However, a page setup part corresponding to a fast read page is not limited to the second page setup part. For example, a fast read page may correspond to a different page setup part depending on a bit ordering for distinguishing between respective program states.

Figure 7:
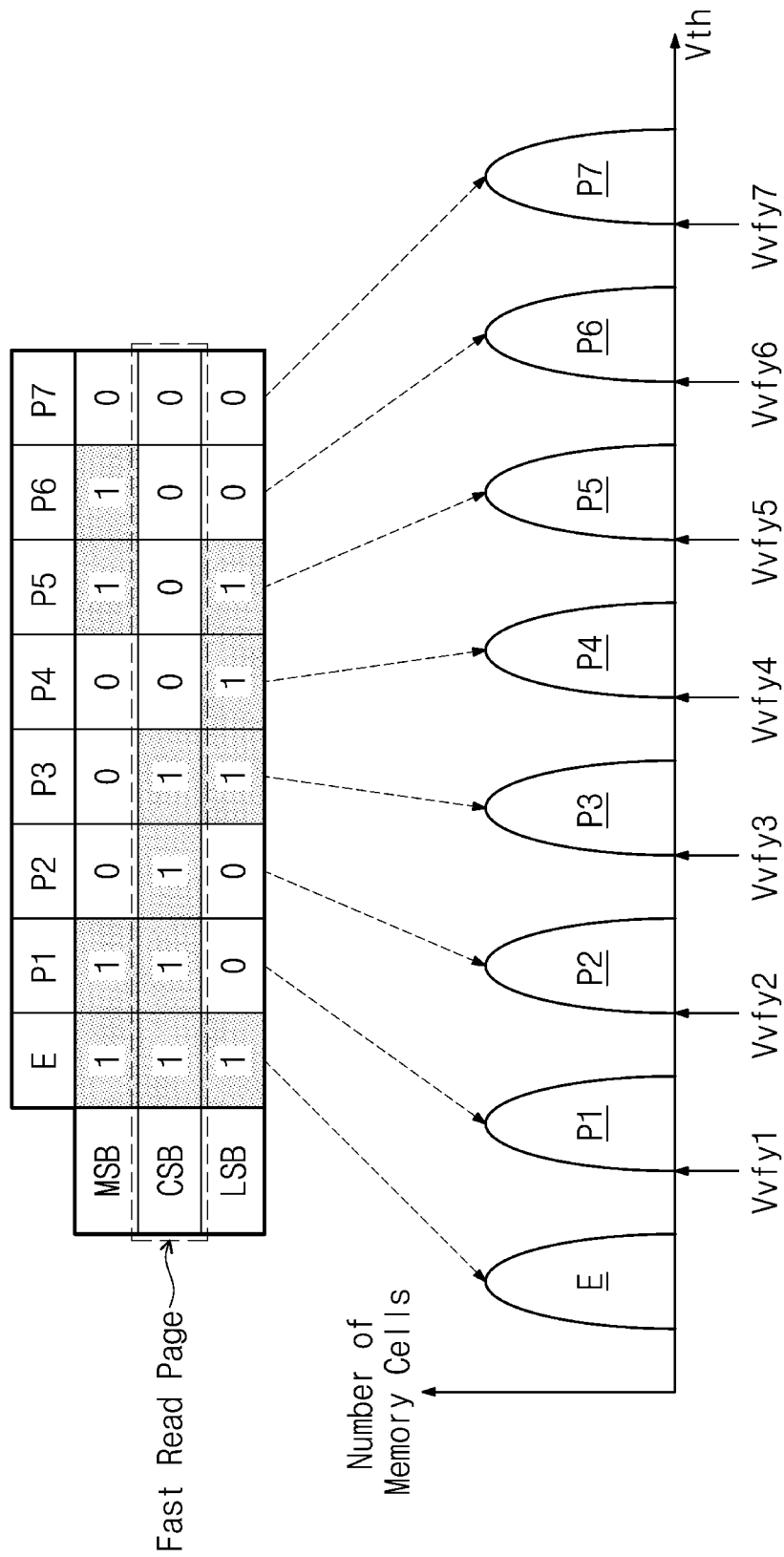
FIG. 7 illustrates a bit ordering and threshold voltage distributions of memory cells programmed based on the bit ordering, according to an exemplary embodiment of the present inventive concept.

FIG. 7 illustrates a bit ordering and threshold voltage distributions of memory cells programmed based on the bit ordering, according to an exemplary embodiment of the present inventive concept.

Below, a description will be given with reference to FIGS. 1, 3, and 7. The memory controller 110 may perform a TLC program, in which page data are expressed by eight program states, with respect to memory cells connected to a selected word line. For example, the memory controller 110 may program the memory cells connected to the selected word line in an incremental step pulse programming (ISPP) scheme, and may verify a program pass/fail by using a first verify voltage Vvfy1 to a seventh verify voltage Vvfy7.

In an exemplary embodiment of the inventive concept, the memory controller 110 programs the memory cells connected to the selected word line such that data of one page of three pages are determined by one read voltage. For example, the memory controller 110 programs the memory cells connected to the selected word line such that an erase state "E," a first program state P1, a second program state P2 and a third program state P3 of the center significant bit (CSB) page correspond to bit "1". The memory controller 110 programs the memory cells connected to the selected word line such that a fourth program state P4, a fifth program state P5, a sixth program state P6 and a seventh program state P7 of the center significant bit (CSB) page correspond to bit "0". According to this scheme, the CSB page includes one bit transition (e.g., a P3 to P4 bit transition) where a bit value is changed. In other words, in the case where the memory controller 110 performs a read operation on the CSB page, data of the CSB page may be determined by one read voltage. In other words, the CSB page may have eight states including the erase state "E", but a data value of the CSB page may be determined by just one read voltage, thus obtaining an effect similar to the SLC program.

In an exemplary embodiment of the inventive concept, a bit ordering may be based on a gray code. In other words, one bit value is changed between two adjacent program states. However, the bit ordering of the present inventive concept is not limited thereto. For example, two or more bit values may be changed between two adjacent program states. However, in this case, the number of read voltages required to determine MSB page data and LSB page data may be greater than "3".

In an exemplary embodiment of the inventive concept, data that are stored at a fast read page may be hot data that are targeted for a frequent read (or are frequently accessed by a memory controller). Alternatively, data that are stored at a fast read page may be data that require high reliability. Alternatively, data that are stored at a fast read page may be data associated with the maintenance of a storage device, or meta data. Alternatively, data that are stored at a fast read page may be data associated with an application to be quickly executed or launched according to a request of a user.

In contrast, data that are stored at a normal read page may be cold data that are not targeted for a frequency read. Alternatively, data that are stored at a normal read page may be data that require relatively low reliability. Alternatively, data that are stored at a normal read page may be data not associated with the maintenance of a storage device, or user data.

Additionally, the memory controller 110 programs the remaining read pages of three pages other than a fast read page, based on a normal TLC program scheme. For example, as illustrated in FIG. 7, to determine data of the MSB page, the MSB page may include three bit transitions (e.g., between P1 and P2, between P4 and P5, and between P6 and P7), and the LSB page may include three bit transitions (e.g., between "E" and P1, between P2 and P3, and between P5 and P6). According to the above description, with regard to pages corresponding to the selected word line, the same number of read voltages used to determine data of the remaining pages (e.g., normal read pages) other than a fast read page may be identical.

Figure 8:
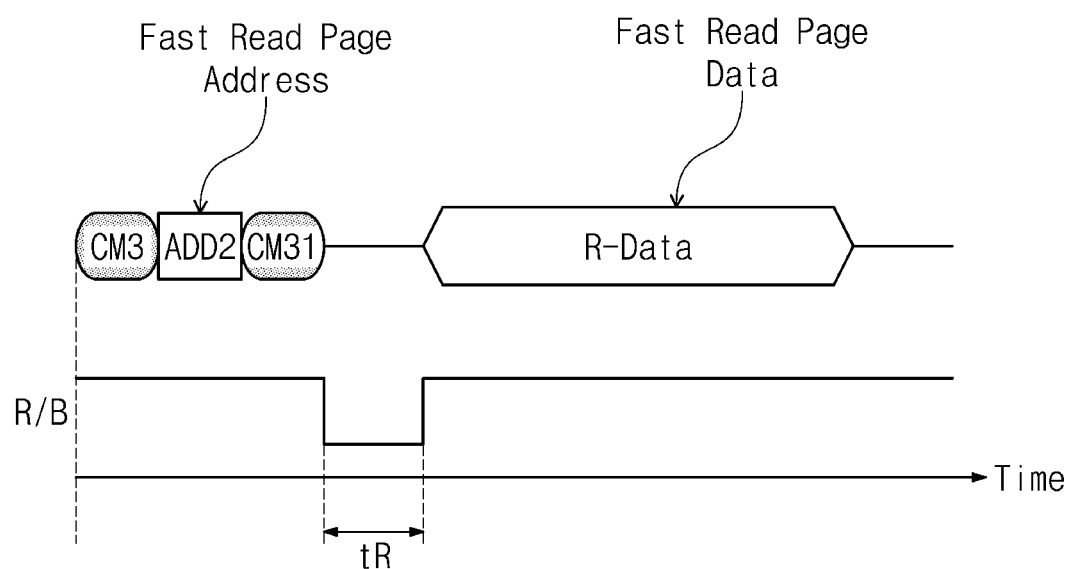
FIG. 8 is a timing diagram for describing an operating method of a storage device according to an exemplary embodiment of the present inventive concept.

FIG. 8 is a timing diagram for describing an operating method of a storage device according to an exemplary embodiment of the present inventive concept.

Referring to FIGS. 1, 3, and 8, the nonvolatile memory device 120 may receive a command CM3, the address ADD2, and a command CM31 from the memory controller 110 through the data line. The commands CM3 and CM31 may be a command set for reading data of a fast read page from the nonvolatile memory device 120. The address ADD2 may indicate an address corresponding to the fast read page.

In an exemplary embodiment of the inventive concept, the commands CM3 and CM31 may be a normal read command. Alternatively, the commands CM3 and CM31 may be a vendor-specific command for reading data from the fast read page. In response to the command CM31, the nonvolatile memory device 120 may transfer SLC page data R-DATA read from the fast read page to the memory controller 110 through the data line.

Figure 9:
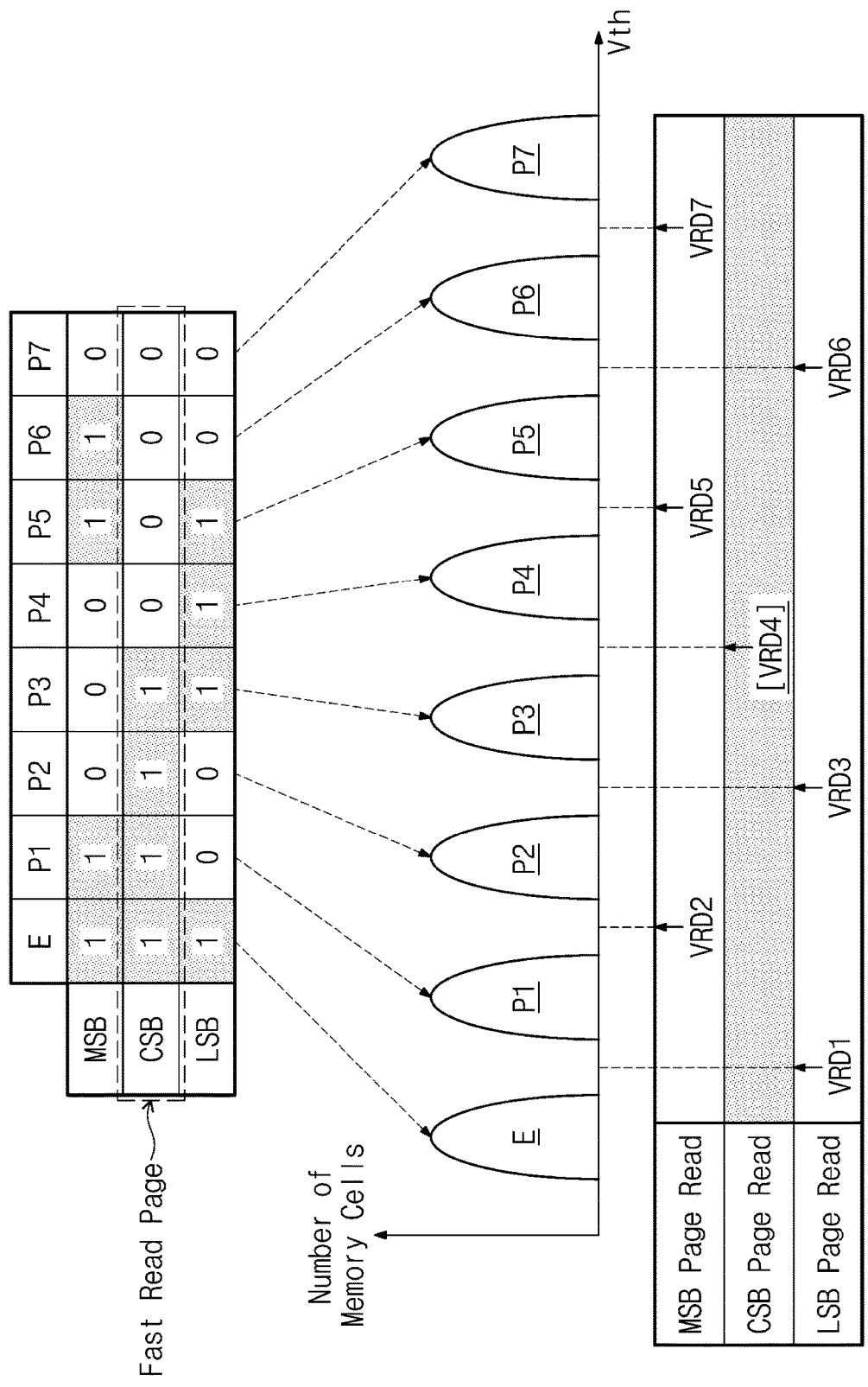
FIG. 9 illustrates a fast read page read and a normal read page read of a storage device when a read operation is performed according to an exemplary embodiment of FIG. 8.

FIG. 9 illustrates a fast read page read and a normal read page read of a storage device when a read operation is performed according to an exemplary embodiment of FIG. 8. For better understanding, a bit ordering of the present inventive concept, threshold voltage distributions according to the bit ordering, and read voltages used for a mad operation of each page are illustrated together.

Referring to FIGS. 1 and 9, the MSB page has the following bit ordering: a bit value of each of the erase state "E" and the first program state P1 is "1", a bit value of each of the second to fourth program states P2, P3, and P4 is "0", a bit value of each of the fifth and sixth program states P5 and P6 is "1", and a bit value of the seventh program state P7 is "0". The MSB page has three bit transitions. The CSB page has the following bit ordering: a bit value of each of the erase state "E" and the first to third program states P1, P2, and P3 is "1", a bit value of each of the fourth to seventh program states P4, P5, P6, and P7 is "0". The CSB page has one bit transition. The LSB page has the following bit ordering: a bit value of the erase state "E" is "1", a bit value of each of the first and second program states P1 and P2 is "0", a bit value of each of the third to fifth program states P3, P4, and P5 is "1", and a bit value of each of the sixth and seventh program states P6 and P7 is "0". The LSB page has three bit transitions.

In an exemplary embodiment of the inventive concept, maximally three read voltages VRD2, VRD5, and VRD7 may be required to read data of the MSB page. For example, the fifth read voltage VRD5, the second read voltage VRD2, and the seventh read voltage VRD7 may be sequentially applied to a memory cell as a read voltage, but the present inventive concept is not limited thereto. For example, firstly, the fifth read voltage VRD5 may be applied to a memory cell having the first program state P1 for the purpose of determining MSB page data of the memory cell. In this case, it may be determined that the memory cell is an on-cell, but whether it has a value of "1" or a value of "0" may be further determined. Afterwards, the second read voltage VRD2 may be applied to the memory cell. In this case, it may be determined that the memory cell is an on-cell, and thus, the memory cell may be finally determined to have a value of "1".

In an exemplary embodiment of the inventive concept, only one read voltage VRD4 may be required to read data of the CSB page. For example, in the case where a memory cell has one of the erase state "E" to the third program state P3, the memory controller 110 may apply the fourth read voltage VRD4 to the memory cell to read data stored in the memory cell, and the memory cells may be determined as an on-cell. In the CSB page, because memory cells having threshold voltages smaller than the fourth read voltage VRD4 store a bit value of "1", an additional read voltage for determination is not required.

In the case where a memory cell has one of the fourth program state P4 to the seventh program state P7, the memory controller 110 may apply the fourth read voltage VRD4 to the memory cell to read data stored in the memory cell, and the memory cells may be determined as an off-cell. In the CSB page, because memory cells having threshold voltages greater than the fourth read voltage VRD4 store a bit value of "0" an additional read voltage for determination is not required.

In an exemplary embodiment of the inventive concept, maximally three read voltages VRD1, VRD3, and VRD6 may be required to read data of the LSB page. For example, the third read voltage VRD3, the first read voltage VRD1, and the sixth read voltage VRD6 may be sequentially applied to a memory cell as a read voltage, but the present inventive concept is not limited thereto. For example, firstly, the third read voltage VRD3 may be applied to a memory cell having the fourth program state P4 to determine LSB page data of the memory cell. In this case, it may be determined that the memory cell is an off-cell, but whether it has a value of "1" or a value of "0" may be further determined. Afterwards, the sixth read voltage VRD6 may be applied to the memory cell. In this case, it may be determined that the memory cell is an on-cell, and thus, the memory cell may be finally determined to have a value of "1".

According to the above description, because only one read voltage (e.g., VRD4) is required to determine data of a fast read page, a read speed of a particular page is increased. Because data of normal read pages are determined by using the same number of read voltages, a uniform read speed may be secured with regard to the normal read pages.

Although FIG. 9 illustrates the CSB page as a fast read page, the inventive concept is not limited thereto. For example, a bit ordering that is different from the bit ordering illustrated in FIG. 9 may be used. In this case, a fast read page may be an MSB page or an LSB page.

Figure 10:
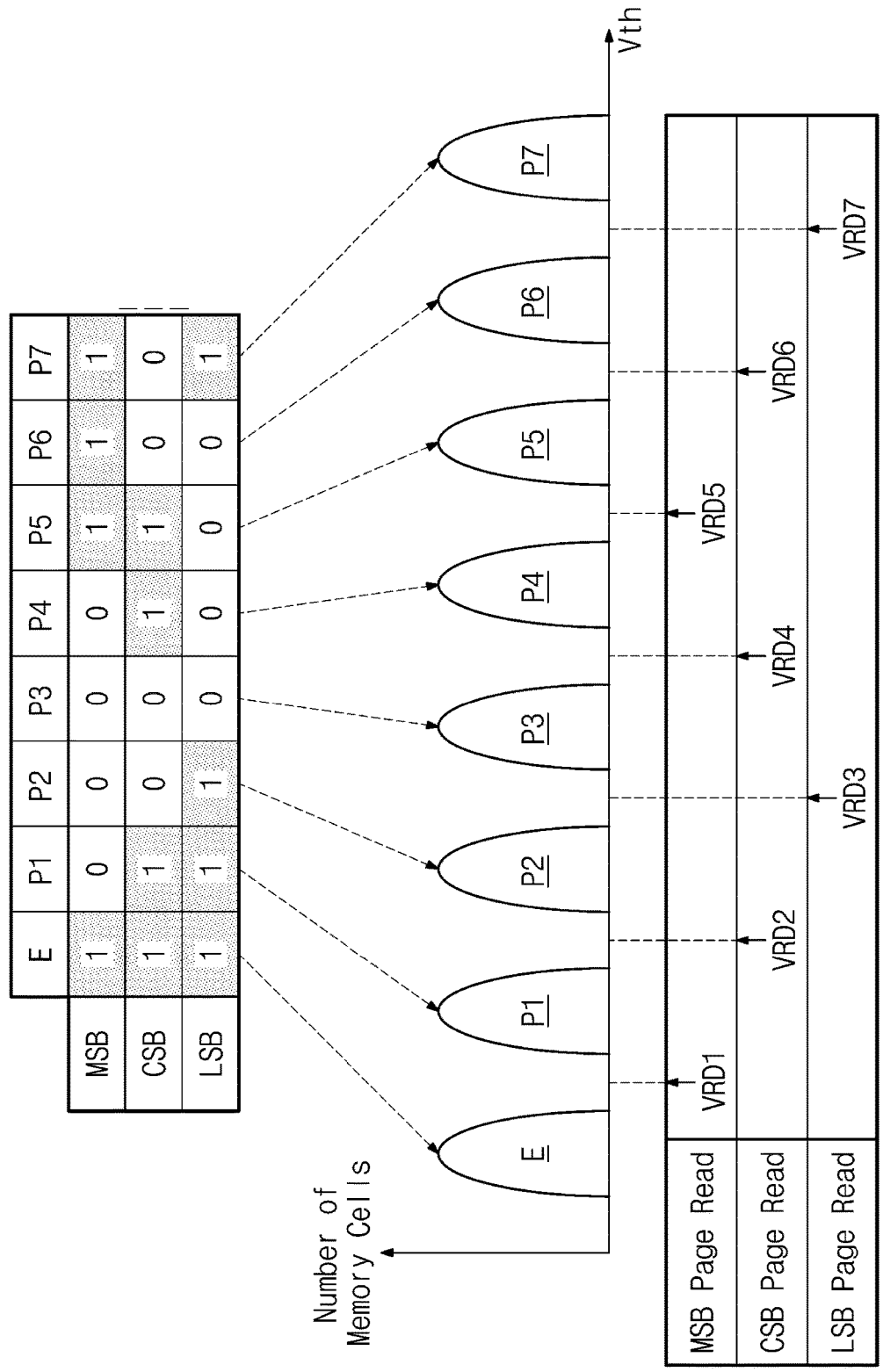
FIG. 10 illustrates a page read of a storage device when a read operation of the storage device is performed according to a normal bit ordering.

FIG. 10 illustrates a page read of a storage device when a read operation of the storage device is performed according to a normal bit ordering.

First, like the bit ordering of the inventive concept described above, a bit ordering illustrated in FIG. 10 is based on a gray code. However, according to the bit ordering of FIG. 10, the number of read voltages used to perform a read operation on each page is mostly identical, and thus, read speeds of the pages are uniform. For example, two read voltages VRD1 and VRD5 are required to determine data of the MSB page, three read voltages VRD2, VRD4, and VRD6 are required to determine data of the CSB page, and two read voltages VRD3 and VRD7 are required to determine data of the LSB page.

According to the bit ordering illustrated in FIG. 10, because the number of read voltages required to determine data of the CSB page is mostly identical to the number of read voltages required to determine data of each of the MSB and LSB pages, read speeds of the respective pages may be relatively uniform. In contrast, according to the bit ordering of the present inventive concept illustrated in FIG. 9, a read speed that is substantially identical to a read speed of an SLC page may be secured by using the fast read page.

Figure 11:
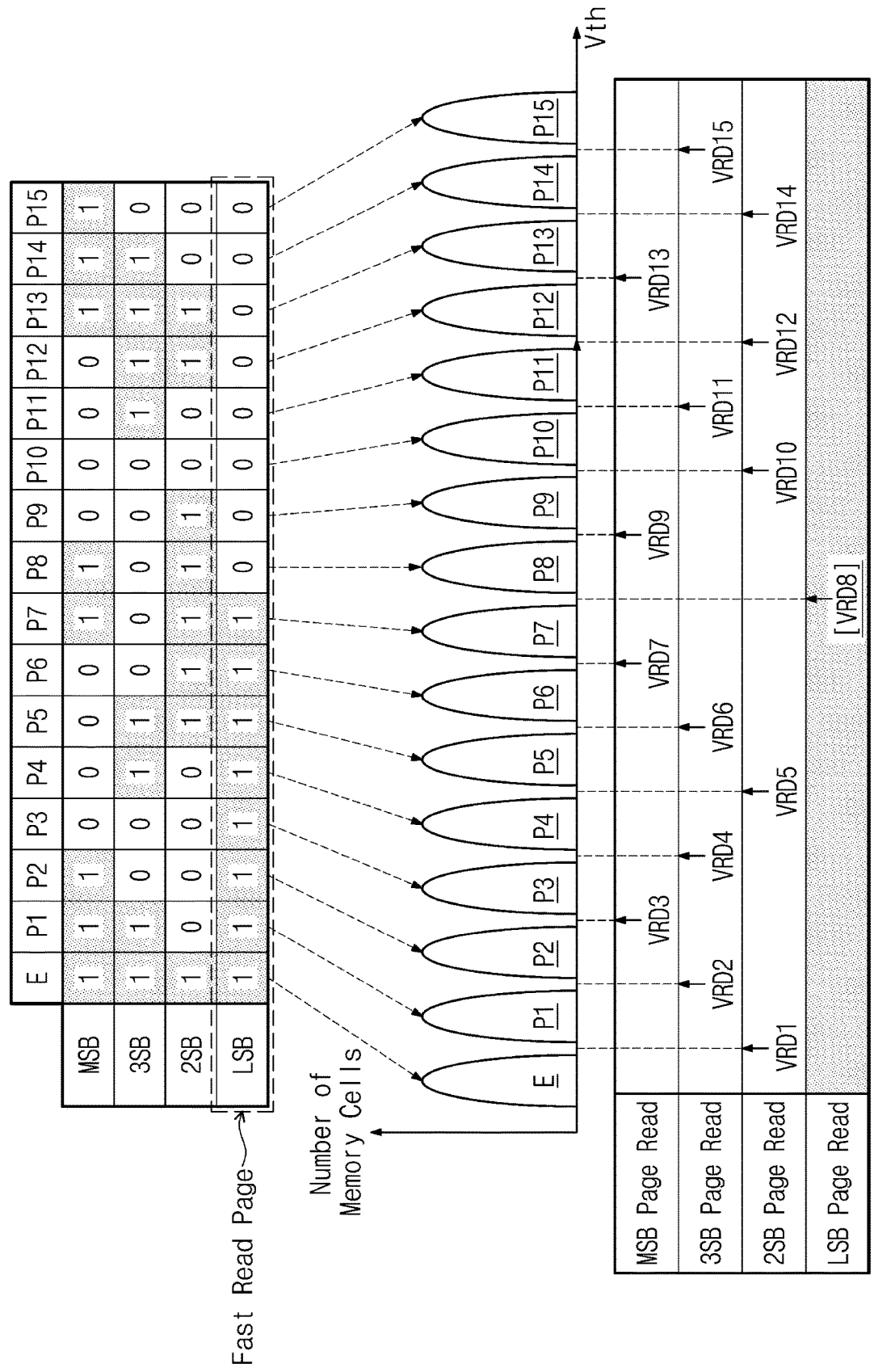
FIG. 11 illustrates a bit ordering according to an exemplary embodiment of the present inventive concept.

FIG. 11 illustrates a bit ordering according to an exemplary embodiment of the present inventive concept.

The embodiment of FIG. 11 illustrates a bit ordering associated with a QLC that stores 4-bit data. For example, the bit ordering of FIG. 11 is based on a gray code. The memory controller 110 (refer to FIG. 1) may perform a QLC program, in which page data are expressed by 15 program states, with respect to memory cells connected to a selected word line. The program process is similar to that described with reference to FIGS. 5 and 6, and thus, additional description may be omitted to avoid redundancy.

According to the bit ordering of the MSB page illustrated in FIG. 11, the MSB page may include four bit transitions (e.g., between P2 and P3, between P6 and P7, between P8 and P9, and between P12 and P13). In other words, the number of read voltages required to determine data of the MSB page is 4 (VRD3, VRD7, VRD9, and VRD13). The number of read voltages required to determine data of a 3$^{rd}$ significant bit (3SB) page is 5 (VRD2, VRD4, VRD6, VRD11, and VRD15) since the number of bit transitions is 5, and the number of read voltages required to determine data of a 2$^{nd}$ significant bit (2SB) page is 5 (VRD1, VRD5, VRD10, VRD12, and VRD14) since the number of bit transitions is 5. The three pages described above, in other words, the MSB page, the 3SB page, and 2SB page may be referred to as "normal read pages". In an exemplary embodiment of the inventive concept, normal pages may not include at least two pages in which the number of read voltages required to determine data increases in order of a power of two.

In the LSB page, a bit value of each of the erase state "E" to the seventh program state P7 is "1", and a bit value of each of the eighth program state P8 to fifteenth program state P15 is "0". According to this bit ordering, the number of read voltages required to determine data of the LSB page is 1 (VRD8). This is so, because there is only one bit transition. For example, in the case where a memory cell has one of the eighth program state P8 to the fifteenth program state P15, the memory controller 110 may apply only the eighth read voltage VRD8 to the memory cell to read data stored in the memory cell. As a result, the memory cells may be determined as an off-cell. In the LSB page, because memory cells having threshold voltages greater than the eighth read voltage VRD8 store a bit value of "0", an additional read voltage for determination is not required.

According to the above description, because only one read voltage (e.g., VRD8) is required to determine data of a fast read page, a read speed of the fast read page (e.g., the LSB page) is increased. Through this bit ordering, it is possible to obtain substantially the same effect as that obtained in the case of reading data from SLC-programmed memory cells. In addition, the number of read voltages necessary to determine data of each of normal read pages (e.g., the MSB page, the 3SB page, and the 2SB page) other than the fast read page is mostly identical. For example, with regard to at least two of the normal read pages, the number of read voltages necessary to determine data is identical. In FIG. 11, the 3SB page and the 2SB page use the same number of read voltages.

Figure 12:
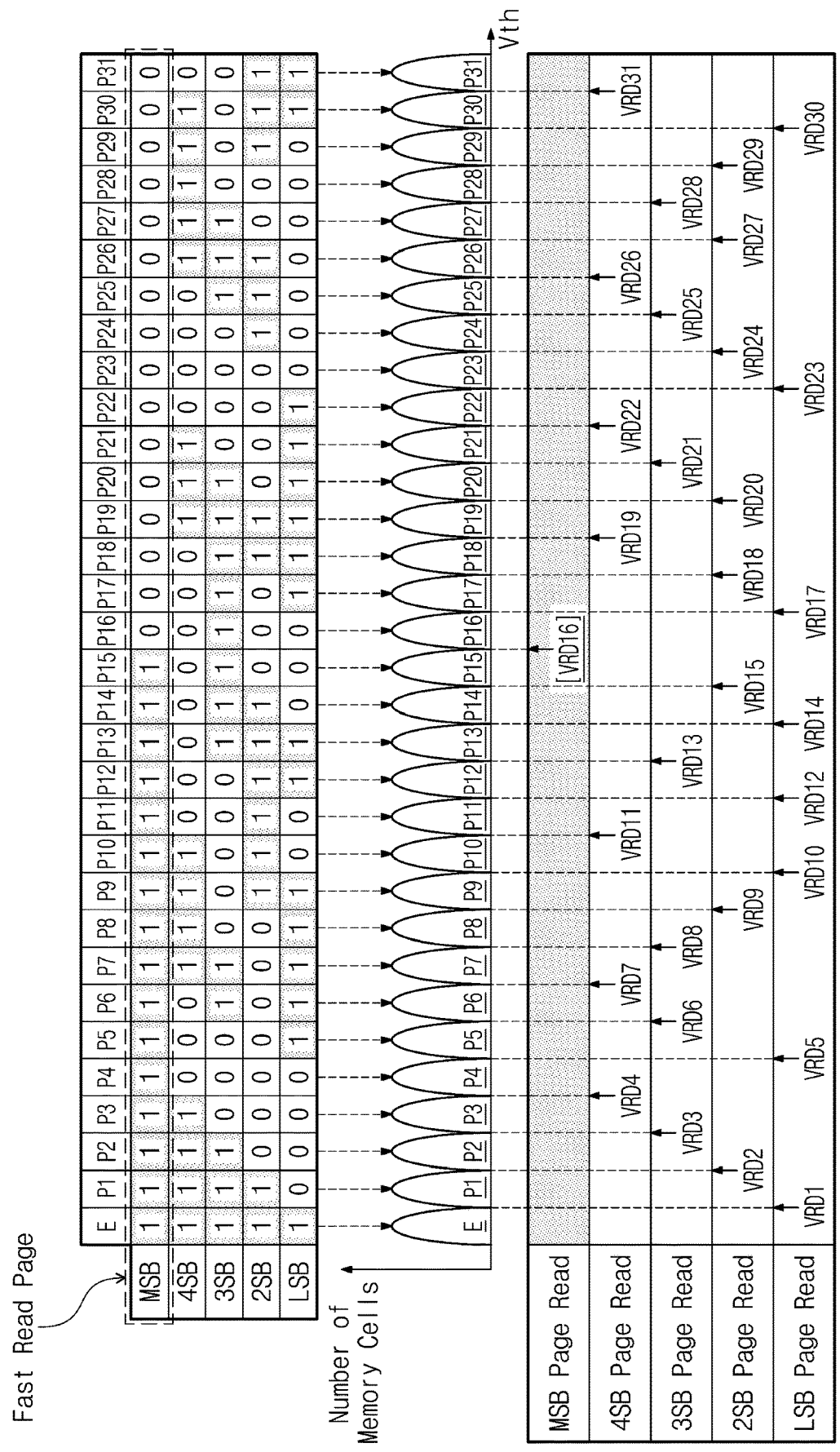
FIG. 12 illustrates a bit ordering according to an exemplary embodiment of the present inventive concept.

FIG. 12 illustrates a bit ordering according to an exemplary embodiment of the present inventive concept.

The embodiment of FIG. 11 illustrates a bit ordering associated with a penta level cell (PLC) that stores 5-bit data. For example, the bit ordering of FIG. 12 is based on a gray code. The memory controller 110 (refer to FIG. 1) may perform a PLC program, in which page data are expressed by 31 program states, with respect to memory cells connected to a selected word line. The program process is similar to that described with reference to FIGS. 5 and 6, and thus, additional description may be omitted to avoid redundancy.

According to the bit ordering of the LSB page illustrated in FIG. 12, the LSB page may include eight bit transitions (e.g., between "E" and P1, between P4 and P5, between P9 and P10, between P11 and P12, between P13 and P14, between P16 and P17, between P22 and P23, and between P29 and P30). In other words, the number of read voltages required to determine data of the LSB page is 8 (VRD1, VRD5, VRD10, VRD12, VRD14, VRD17, VRD23, and VRD30).

The number of read voltages required to determine data of a 2SB page is 8 (VRD2, VRD9, VRD15, VRD18, VRD20, VRD24, VRD27, and VRD29), the number of read voltages required to determine data of a 3SB page is 7 (VRD3, VRD6, VRD8, VRD13, VRD21, VRD25, and VRD28), and the number of read voltages required to determine data of a 4th significant bit (4SB) page is 7 (VRD4, VRD7, VRD11, VRD19, VRD22, VRD26, and VRD31). The four pages described above, in other words, the LSB page, the 2SB page, the 3SB page, and the 4SB page may be referred to as "normal read pages".

In the MSB page, a bit value of each of the erase state "E" to the fifteenth program state P15 is "1", and a bit value of each of the sixteenth program state P16 to the 31st program state P31 is "0". According to this bit ordering, the number of read voltages required to determine data of the MSB page is 1 (VRD16). For example, in the case where a memory cell has one of the sixteenth program state P16 to the 31st program state P31, the memory controller 110 may apply only the sixteenth read voltage VRD16 to the memory cell to read data stored in the memory cell. As a result, the memory cells may be determined as an off-cell. In the MSB page, because memory cells having threshold voltages greater than the sixteenth read voltage VRD16 store a bit value of "0", an additional read voltage for determination is not required.

As a result, by using the bit ordering illustrated in FIG. 12, a read speed of a fast read page (e.g., the MSB page) is increased. Through this bit ordering, it is possible to obtain substantially the same effect as that obtained in the case of reading data from SLC-programmed memory cells. For example, according to the bit ordering illustrated in FIG. 12, with regard to at least two normal read pages, the number of read voltages necessary to determine data is identical. For example, the number of read voltages necessary to determine data is 8 in the case of the LSB page and the 2SB page; and the number of read voltages necessary to determine data is 7 in the case of the 3SB page and the 4SB page.

Figure 13:
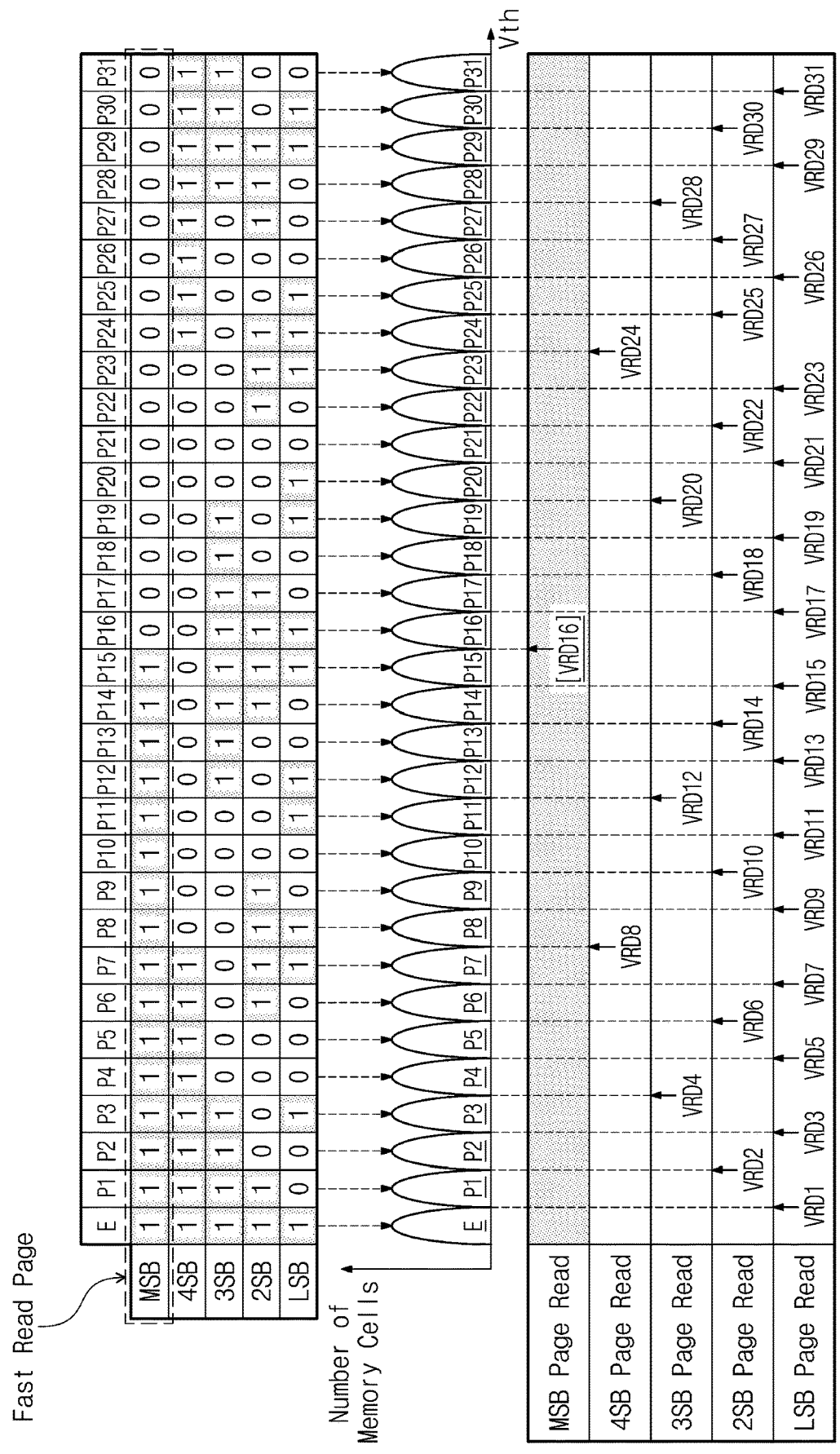
FIG. 13 illustrates a bit ordering according to an exemplary embodiment of the present inventive concept.

FIG. 13 illustrates a bit ordering according to an exemplary embodiment of the present inventive concept.

Like the embodiment of FIG. 12, the embodiment of FIG. 13 illustrates a bit ordering of a PLC that stores 5-bit data. For example, the bit ordering of FIG. 13 is based on a gray code.

According to the bit ordering of the LSB page illustrated in FIG. 13, the LSB page may include 15 bit transitions (e.g., between "E" and P1, between P2 and P3, between P3 and P4, between P6 and P7, between P8 and P9, between P10 and P1, between P12 and P13, between P14 and P15, between P16 and P17, between P18 and P19, between P20 and P21, between P22 and P23, between P25 and P26, between P28 and P29, and between P30 and P31). In other words, the number of read voltages required to determine data of the LSB page is 15 (VRD1, VRD3, VRD5, VRD7, VRD9, VRD11, VRD13, VRD15, VRD17, VRD19, VRD21, VRD23, VRD26, VRD29, and VRD31).

The number of read voltages required to determine data of a 2SB page is 9 (VRD2, VRD6, VRD10, VRD14, VRD18, VRD22, VRD25, VRD27, and VRD30), the number of read voltages required to determine data of a 3SB page is 4 (VRD4, VRD12, VRD20, and VRD28), and the number of read voltages required to determine data of a 4SB page is 2 (VRD8 and VRD24). The four pages described above, in other words, the LSB page, the 2SB page, the 3SB page, and the 4SB page may be referred to as "normal read pages".

In the MSB page, a bit value of each of the erase state "F" to the fifteenth program state P15 is "1", and a bit value of each of the sixteenth program state P16 to the 31st program state P31 is "0". According to this bit ordering, the number of read voltages required to determine data of the MSB page is 1 (VRD16). Regardless of whether a memory cell has any program state, only the sixteenth read voltage VRD16 is required to determine data stored in the memory cell, and an additional read voltage for determination is not required.

According to this bit ordering, a hierarchical memory may be implemented by allowing pages of memory cells connected to a selected word line to have different read speeds. For example, data that requires the highest reliability or requires the fastest read speed may be stored at the MSB page. In contrast, data that does not require the highest reliability or does not require the fastest read speed may be stored at the LSB page. Depending on required reliability and/or a required read speed, data may be stored at an appropriate page of the 2SB page, the 3SB page, and the 4SB page.

According to the exemplary embodiments of the inventive concept described above, a memory area may be prevented from being wasted by performing only the SLC program on memory cells connected to a selected word line. For example, assuming the case where an entire memory block is SLC-programmed and provides a capacity of 1 MB. In this case, when the entire memory block is TLC-programmed, the memory block provides a capacity of 3 MB. In addition, when the entire memory block is QLC-programmed, the memory block provides a capacity of 4 MB. In other words, when the entire memory block is SLC-programmed, the loss of a memory space is considerable.

However, according to an exemplary embodiment of the inventive concept, memory cells connected to a selected word line include a fast read page in which data are determined by using one read voltage, as well as normal read pages in which data are determined by using a plurality of read voltages. Because data of the fast read page are determined by using only one read voltage, it is possible to obtain substantially the same effect as that obtained by the SLC program. In other words, a read speed of the fast read page is identical to a read speed of an SLC page in which one bit is stored per memory cell. In addition, a storage area may be prevented from being wasted by using the SLC program.

Figure 14:
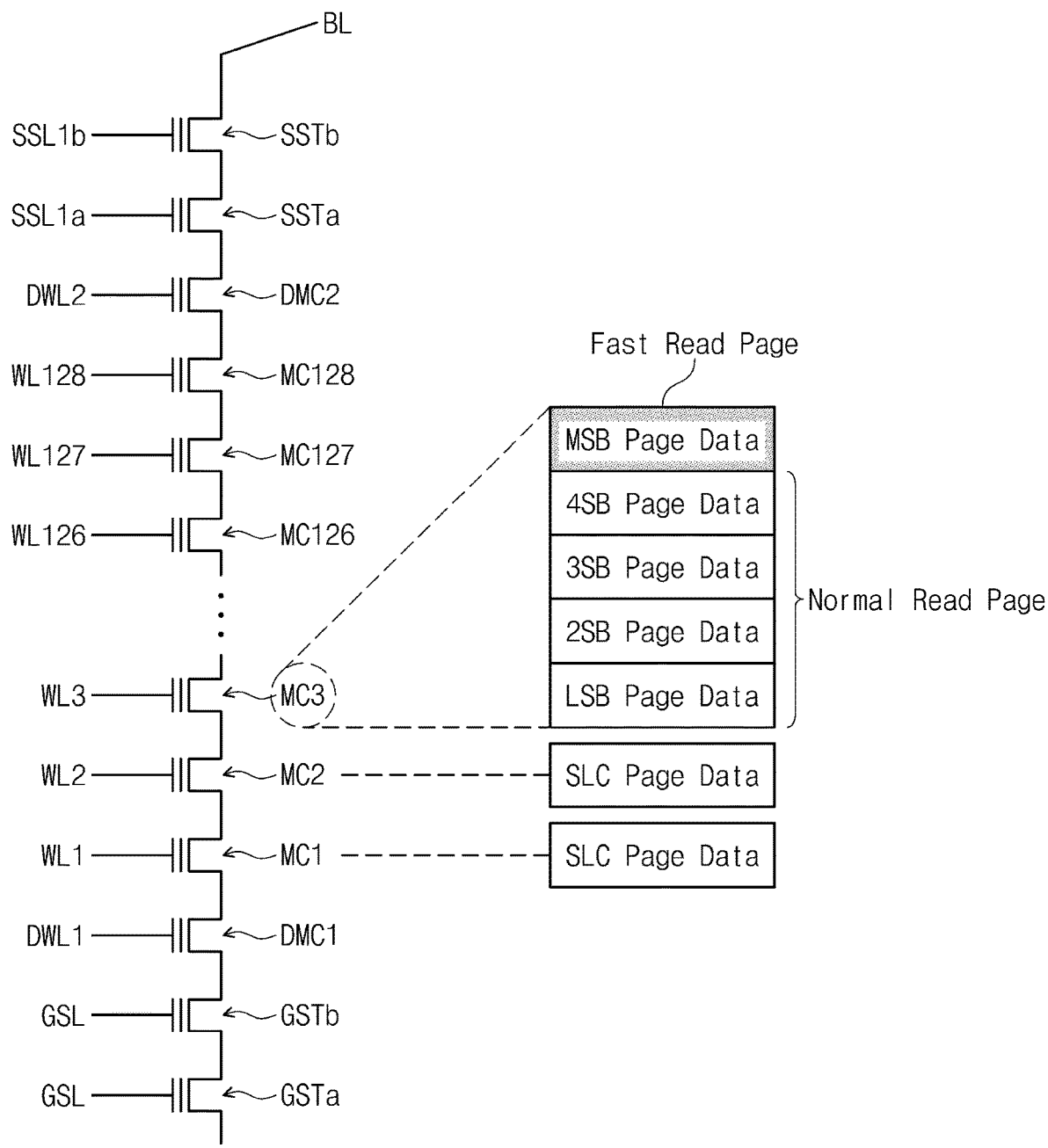
FIG. 14 illustrates a portion of a circuit diagram of FIG. 4.

FIG. 14 illustrates a portion of a circuit diagram of FIG. 4. A physical location of a memory block, at which a fast read page according to an exemplary embodiment of the present inventive concept is stored, will be described with reference to FIGS. 12 to 14 together.

The MLC, TLC, QLC, and PLC, each of which stores a plurality of bits, are prone to deterioration compared with the SLC that stores one bit. For example, as the number of bits to be stored per cell increases, the deterioration may worsen. Accordingly, the SLC program may be performed on memory cells connected to a word line (e.g., WL1, or WL1 and WL2) adjacent to the ground selection transistors GSTa and GSTb. As a distance from the ground selection transistors GSTa and GSTb increases, the number of data bits to be stored in a memory cell may increase.

In an exemplary embodiment of the inventive concept, the SLC program may be performed on memory cells MC1 and MC2 connected to the first word line WL1 and the second word line WL2. The PLC program may be performed on memory cells MC3 connected to the third word line WL3. In this case, according to the bit ordering illustrated in FIG. 12, the MSB page may be a fast read page that requires one read voltage to determine data, and the remaining pages may be normal read pages.

The SLC program may be performed on memory cells connected to a word line (e.g., WL127, or WL127 and WL128) adjacent to the string selection transistors SSTa and SSTb. As a distance from the string selection transistors SSTa and SSTb increases, the number of data bits to be stored in a memory cell may increase. The PLC program may be performed on memory cells connected to the 126th word line WL126. The MSB page of pages of memory cells connected to the 126th word line WL126 may be a fast read page that requires one read voltage to determine data, and the remaining pages of the memory cells connected to the 126th word line may be normal read pages.

In another exemplary embodiment of the inventive concept, the SLC program may be performed on memory cells MC1 connected to the first word line WL1. The TLC program may be performed on memory cells MC2 connected to the second word line WL2. In this case, the CSB page of pages of memory cells MC2 connected to the second word line WL2 may be a fast read page as described with reference to FIG. 9, and the LSB page and the MSB page may be normal read pages. The QLC program may be performed on memory cells MC3 connected to the third word line WL3. In this case, the LSB page of pages of memory cells MC3 connected to the third word line WL3 may be a fast read page that requires one read voltage to determine data, and the remaining pages of the memory cells connected to the third word line WL3 may be normal read pages.

Additionally, a scheme to program a fast read page depending on a location of a word line is not limited to the above described embodiments. In other words, a similar program method may be implemented such that the number of bits to be stored per memory cell increases as a distance from a ground selection transistor or a string selection transistor increases.

Figure 15:
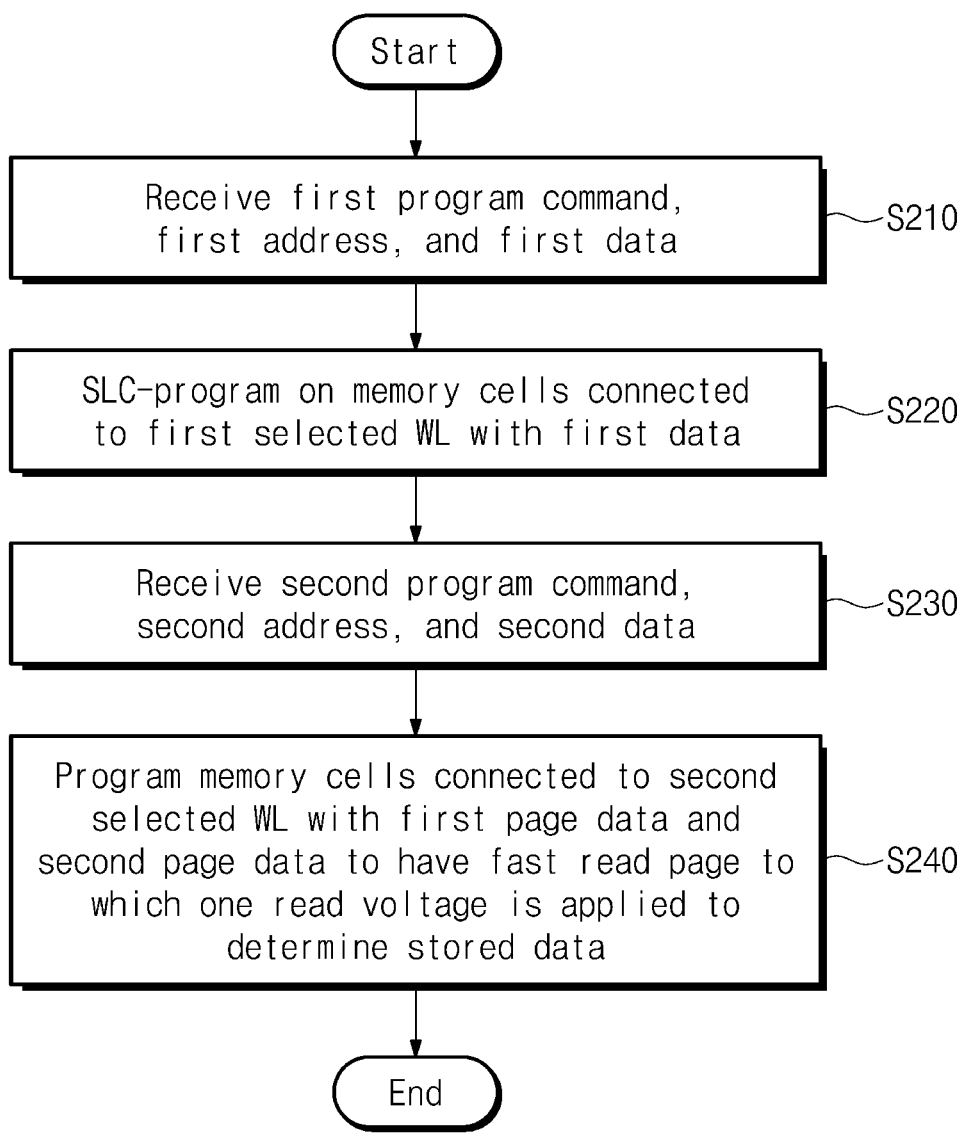
FIG. 15 illustrates an operating method of a storage device according to an exemplary embodiment of the present inventive concept.

FIG. 15 illustrates an operating method of a storage device according to an exemplary embodiment of the present inventive concept. A method in which a fast read page is performed on memory cells connected to a selected word line will be described with reference to FIGS. 1, 3, and 15.

In operation S210, the nonvolatile memory device 120 receives a first program command, a first address, and first data from the memory controller 110. The first program command may be associated with the SLC program, and the first address may be associated with an address of a page where the SLC program is performed.

In an exemplary embodiment of the inventive concept, the first data may be hot data targeted for a frequent read. Alternatively, the first data may be data that require high reliability. Alternatively, the first data may be data associated with the maintenance of a system device, or meta data. Alternatively, the first data may be data associated with an application to be quickly executed depending on a request of the user.

In operation S220, the first data may be programmed in memory cells connected to a first selected word line through the SLC program.

In operation S230, the nonvolatile memory device 120 receives a second program command, a second address, and second data from the memory controller 110. The second program command may be associated with the TLC program, the QLC program, or the PLC program, and the second address may be associated with an address of a page where the TLC/QLC/PLC program is performed.

In an exemplary embodiment of the inventive concept, unlike the first data, the second data may be data that do not require high reliability. Alternatively, the second data may be data that are not associated with the maintenance of a system device or are not meta data. In operation S240, memory cells connected to a second selected word line are programmed based on first data previously stored in the nonvolatile memory device 120, and the second command, the second address, and the second data received from the memory controller 110.

For example, the first data previously stored in the nonvolatile memory device 120 may be stored at the fast read page of the memory cells connected to the second selected word line. The second data received from the memory controller 110 may be stored at normal read pages of the memory cells connected to the second selected word line. For example, a bit ordering forming the fast read page and the normal read pages may be based on the bit ordering described with reference to FIG. 9, 11, 12, or 13. Accordingly, data of the fast read page may be composed of continuous bits of "1" and continuous bits of "0" such that a data value of the fast read page is determined by one read voltage. However, the bit ordering is not limited to the bit orderings illustrated in FIGS. 9, 11, 12, and 13. For example, the inventive concept may be applied to various bit orderings that make it possible to implement a fast read page.

Figure 16:
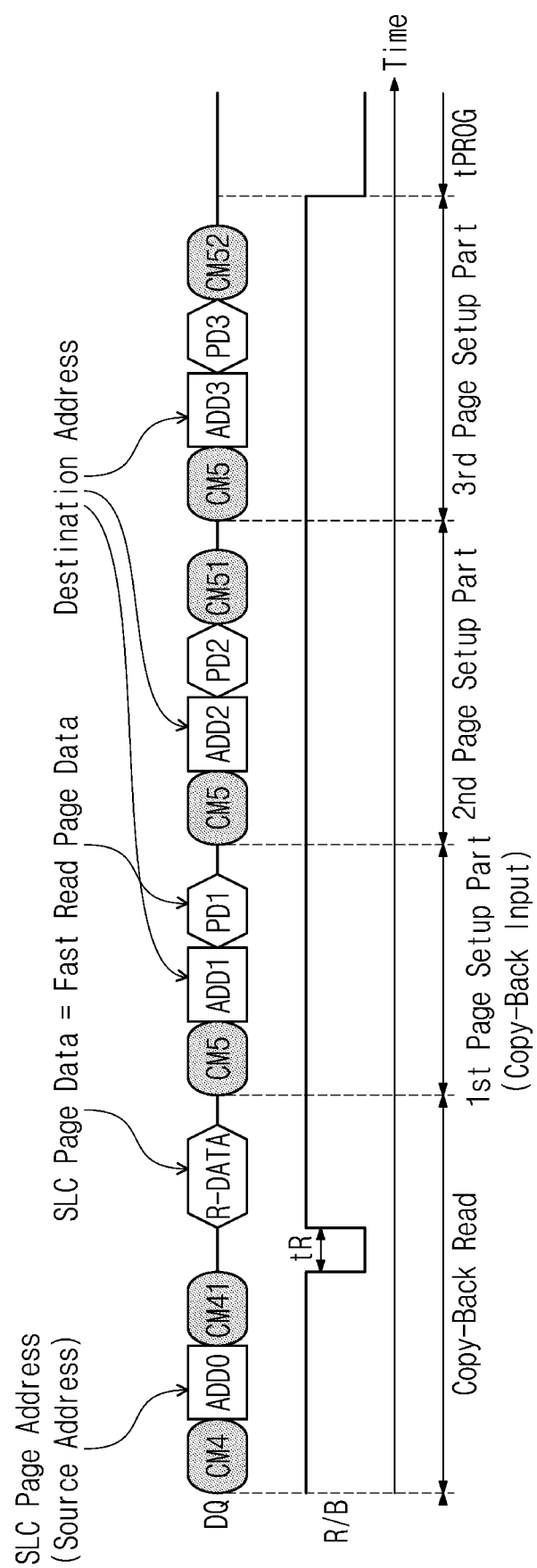
FIG. 16 is a timing diagram for describing an operating method of a storage device of FIG. 15.

FIG. 16 is a timing diagram for describing an operating method of a storage device described with reference to FIG. 15. A program method for the nonvolatile memory device 120 using a copy-back program with a random data command will be described with reference to FIGS. 1, 15, and 16 together. For example, FIG. 16 is associated with a program for the TLC that stores 3-bit data.

During a copy-back read, the nonvolatile memory device 120 may receive a command CM4, an address ADD0, and a command CM41 from the memory controller 110. The commands CM4 and CM41 may be a command set for performing the copy-back read on SLC page data stored at the address ADD0 of the nonvolatile memory device 120. The address ADD0 may be a source address at which SLC page data targeted for the copy-back are stored. In other words, the address ADD0 may be an SLC page address.

In response to the command CM41, the nonvolatile memory device 120 may transfer SLC page data R-DATA stored at an area corresponding to the address ADD0 to the memory controller 110. For example, the SLC page data R-DATA may be hot data targeted for a frequent read, data requiring high reliability, data associated with the maintenance of a system, meta data, etc.

During a first page setup part, the nonvolatile memory device 120 may receive a command CM5, a first address ADD1, and first page data PD1 from the memory controller 110. The command CM5 may be a command for again programming the SLC page data R-DATA read from the nonvolatile memory device 120 in the nonvolatile memory device 120. In other words, the first page data PD1 may be identical to the SLC page data R-DATA. The first address ADD1 that is a portion of a destination address may correspond to a fast read page of pages of memory cells connected to a selected word line. The first address ADD1 may be different from the address ADD0 and may belong to a block that is identical to or different from a memory block to which the address ADD0 belongs. The nonvolatile memory device 120 may dump the first page data PD1 in response to the command CM5.

During a second page setup part, the nonvolatile memory device 120 may receive the command CM5, a second address ADD2, second page data PD2, and a command CM51 from the memory controller 110. The command CM5 and CM51 may be commands for setting up the second page data PD2. The second address ADD2 that is a portion of the destination address may correspond to a normal read page of the pages of the memory cells connected to the selected word line. The nonvolatile memory device 120 may dump the second page data PD2 in response to the command CM51.

During a third page setup part, the nonvolatile memory device 120 may receive the command CM5, a third address ADD3, third page data PD3, and a command CM52 from the memory controller 110. The command CM5 and CM52 may be commands for setting up the third page data PD3. The third address ADD3 that is a portion of the destination address may correspond to a normal read page of the pages of the memory cells connected to the selected word line. The nonvolatile memory device 120 may dump the third page data PD3 in response to the command CM52.

Three page setup parts for the TLC program have just been described as an example, but the number of page setup parts may vary depending on the number of data bits to be stored in a memory cell.

Afterwards, the first page data PD1, the second page data PD2, and the third page data PD3 may be programmed in the memory cells connected to the selected word line. In an exemplary embodiment of the inventive concept, a first page may be a fast read page in which data are determined by one read voltage, and a second page and a third page may be normal read pages in which a plurality of read voltages are required to determine data.

Figure 17:
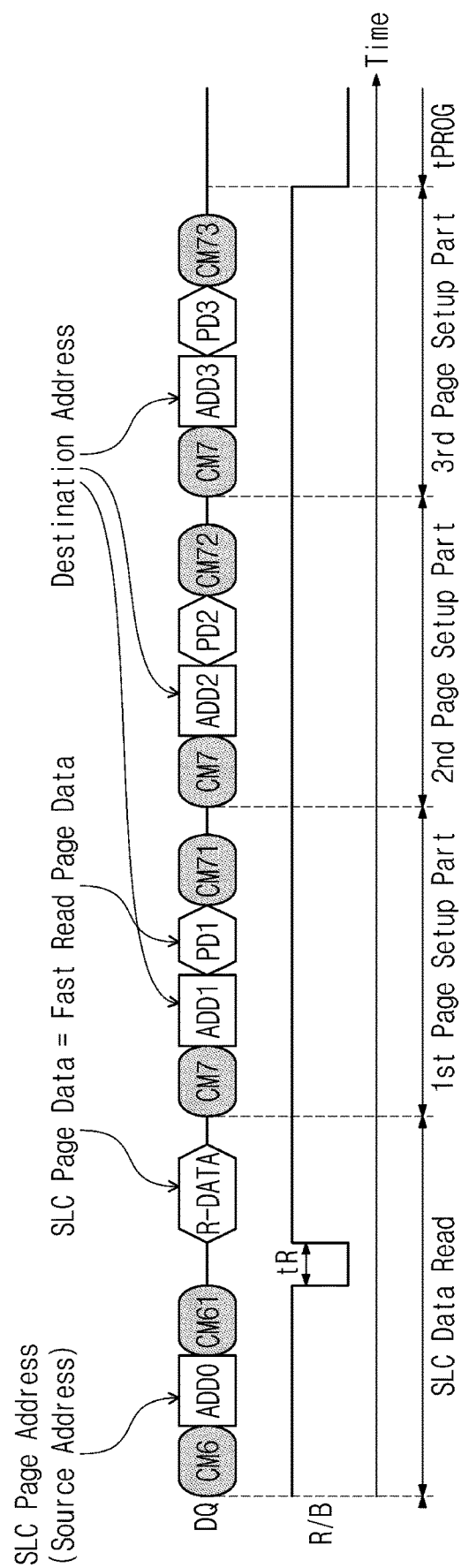
FIG. 17 is a timing diagram for describing an operating method of a storage device of FIG. 15.

FIG. 17 is a timing diagram for describing an operating method of a storage device described with reference to FIG.

15. The embodiment of FIG. 17 is similar to the embodiment of FIG. 16 except that a vendor-specific command is used instead of the copy-back command. Accordingly, a difference will be mainly described with reference to FIGS. 1, 15, and 17 together.

During an SLC data read, the nonvolatile memory device 120 may receive a command CM6, an address ADD0, and a command CM61 from the memory controller 110. The nonvolatile memory device 120 may read SLC page data R-DATA in response to the command CM61.

During a first page setup part, the nonvolatile memory device 120 may receive a command CM7, a first address ADD1, first page data PD1, and a command CM71 from the memory controller 110. The nonvolatile memory device 120 may dump the SLC page data R-DATA in response to the command CM71. Operations of a second page setup part and a third page setup part are similar to the above operation of the first page setup part. For example, during the second page setup part, the nonvolatile memory device 120 may receive the command CM7, a second address ADD2, second page data PD2, and a command CM72 from the memory controller 110, and during the third page setup part, the nonvolatile memory device 120 may receive the command CM7, a third address ADD3, third page data PD3, and a command CM73 from the memory controller 110.

The above commands CM6 and CM7 may be vendor-specific commands for programming SLC page data previously stored in the nonvolatile memory device 120 and the first to third page data PD1 to PD3 newly received, in memory cells connected to a selected word line.

FIG. 18 is a table illustrating the average number of read voltages required to determine page data depending on a page type.

As described above, in the fast read page according to an exemplary embodiment of the inventive concept and a normal SLC page, the number of read voltages necessary to determine page data is identically "1".

The number of read voltages necessary to determine data of a normal read data according to the bit ordering of an exemplary embodiment of the inventive concept is "3" in the case of the TLC. For example, the number of read voltages necessary to determine data of each of the MSB and LSB pages according to the bit ordering illustrated in FIG. 9 is "3", and thus, the average number of read voltages in each page may be "3".

The number of read voltages necessary to determine data of a normal read page according to the bit ordering of an exemplary embodiment of the inventive concept is "4.7" in the case of the QLC. For example, according to the bit ordering illustrated in FIG. 11, the number of read voltages necessary to determine data of each of the 2SB, 3SB and MSB pages are "5", "5" and "4", respectively, and thus, the average number of read voltages in each page may be "4.7".

The number of read voltages necessary to determine data of a normal read page according to the bit ordering of an exemplary embodiment of the inventive concept is "7.5" in the case of the PLC. For example, according to the bit ordering illustrated in FIG. 12, the number of read voltages necessary to determine data of each of the 2SB, 3SB and MSB pages are "8", "8" and "7", respectively, and thus, the average number of read voltages in each page may be "7.5".

Unlike the bit orderings illustrated in FIGS. 9, 11, and 12, in the case of a hexa level cell (HLC), the average number of read voltages necessary to determine data of a normal read page according to the bit ordering of the inventive concept is "12.4".

In FIG. 18, a page according to an existing bit ordering is expressed as a legacy page, and the average number of read voltages necessary to determine data of the TLC page, the average number of read voltages necessary to determine data of the QLC page, the average number of read voltages necessary to determine data of the PLC page, and the average number of read voltages necessary to determine data of the HLC page are "2.3", "3,8", "6.2", and "10.5", respectively.

Comparing the number of read voltages necessary to determine data of each page according to the bit ordering of an exemplary embodiment of the inventive concept with the number of read voltages necessary to determine data of each page according to an existing bit ordering, the number of read voltages for a normal read page an exemplary embodiment of the inventive concept may be a little bit more than the number of read voltages for an existing legacy read page. The reason is that memory cells connected to a selected word line include a fast read page in which data are determined by one read voltage. However, an exemplary embodiment of the inventive concept is advantageous in consideration of the following: simultaneously programming a fast read page and normal read page at memory cells connected to a selected word line, securing the reliability of data through the fast read page, and securing an additional storage space compared to the case where the SLC program is solely performed.

Figure 19B:
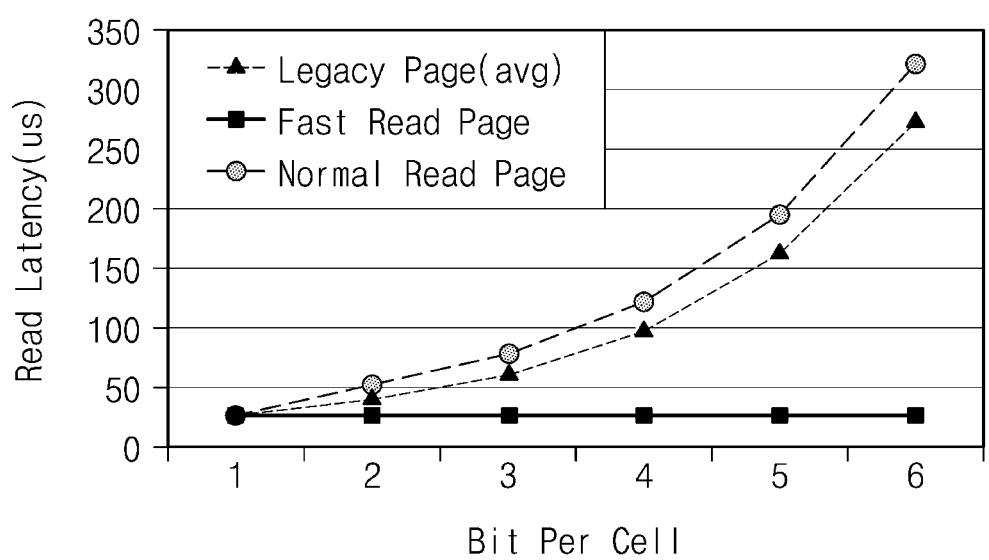
FIG. 19B is a graph illustrating read times for respective page types of FIG. 19A.

FIG. 19A is a table illustrating a read time taken to determine page data depending on a page type, and FIG. 19B is a graph illustrating read times for respective page types of FIG. 19A.

Referring to FIGS. 19A and 19B, a read latency of a fast read page according to the bit ordering of an exemplary embodiment of the present inventive concept and a read latency of an SLC page according to an existing bit ordering is identically 26 microseconds. As the number of bits to be stored per memory cell increases, a read latency also increases. For example, the normal read latency goes from 78 to 322 microseconds and the legacy read latency goes from 61 to 273 microseconds. Like the pattern obtained by analyzing the table of FIG. 18, because the number of read voltages for a normal read page according to the bit ordering of an exemplary embodiment of the present inventive concept is somewhat more than the number of read voltages for a legacy page, a read latency of the normal read page is somewhat greater than a read latency of a legacy page. However, an exemplary embodiment of the inventive concept is advantageous in consideration of the following: securing the reliability of data through a fast read page and securing an additional storage space compared to the case where the SLC program is solely performed.

Figure 20:
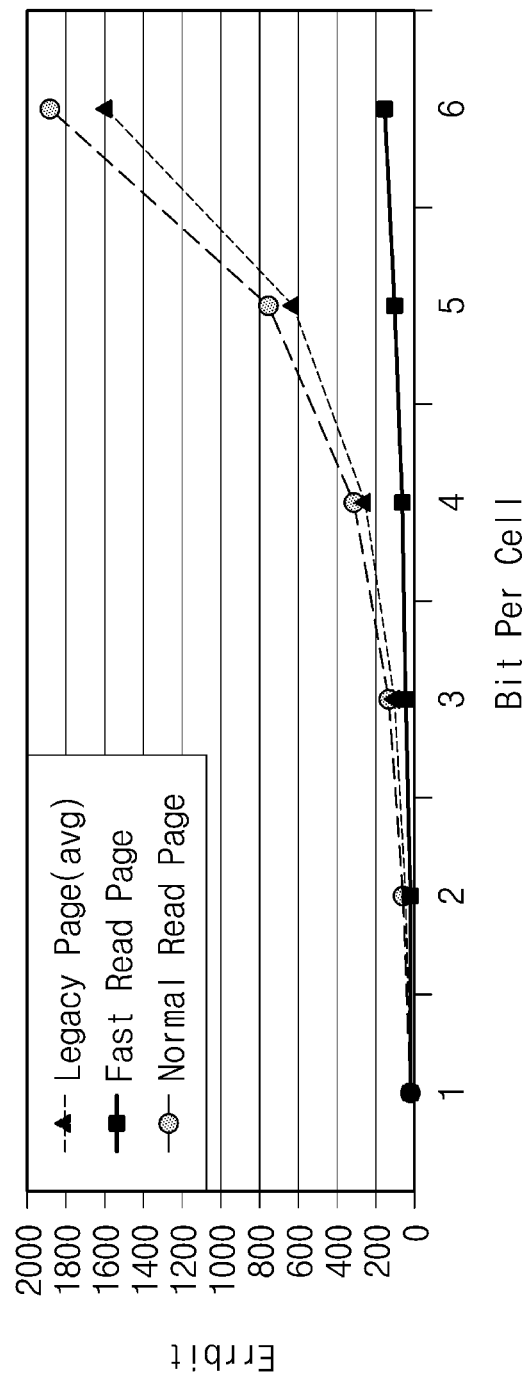
FIG. 20 is a graph illustrating the number of error bits associated with the number of bits to be stored per memory cell, for each page type.

FIG. 20 is a graph illustrating the number of error bits associated with the number of bits to be stored per memory cell, for each page type.

As understood from the graph, the number of error bits associated with a fast read page according to the bit ordering of an exemplary embodiment of the present inventive concept is substantially identical to the number of error bits associated with an SLC page according to an existing bit ordering.

However, in the case of a read operation for a normal read page according to the bit ordering of an exemplary embodiment of the present inventive concept, because the number of read voltages necessary to determine page data is a few more than a legacy page, the number of error bits of the normal read page is a few more than the number of error bits of the legacy page. However, considering that the high reliability of data is secured through the fast read page, the increase in the number of error bits in the normal read page may be sufficiently offset.

Figure 21:
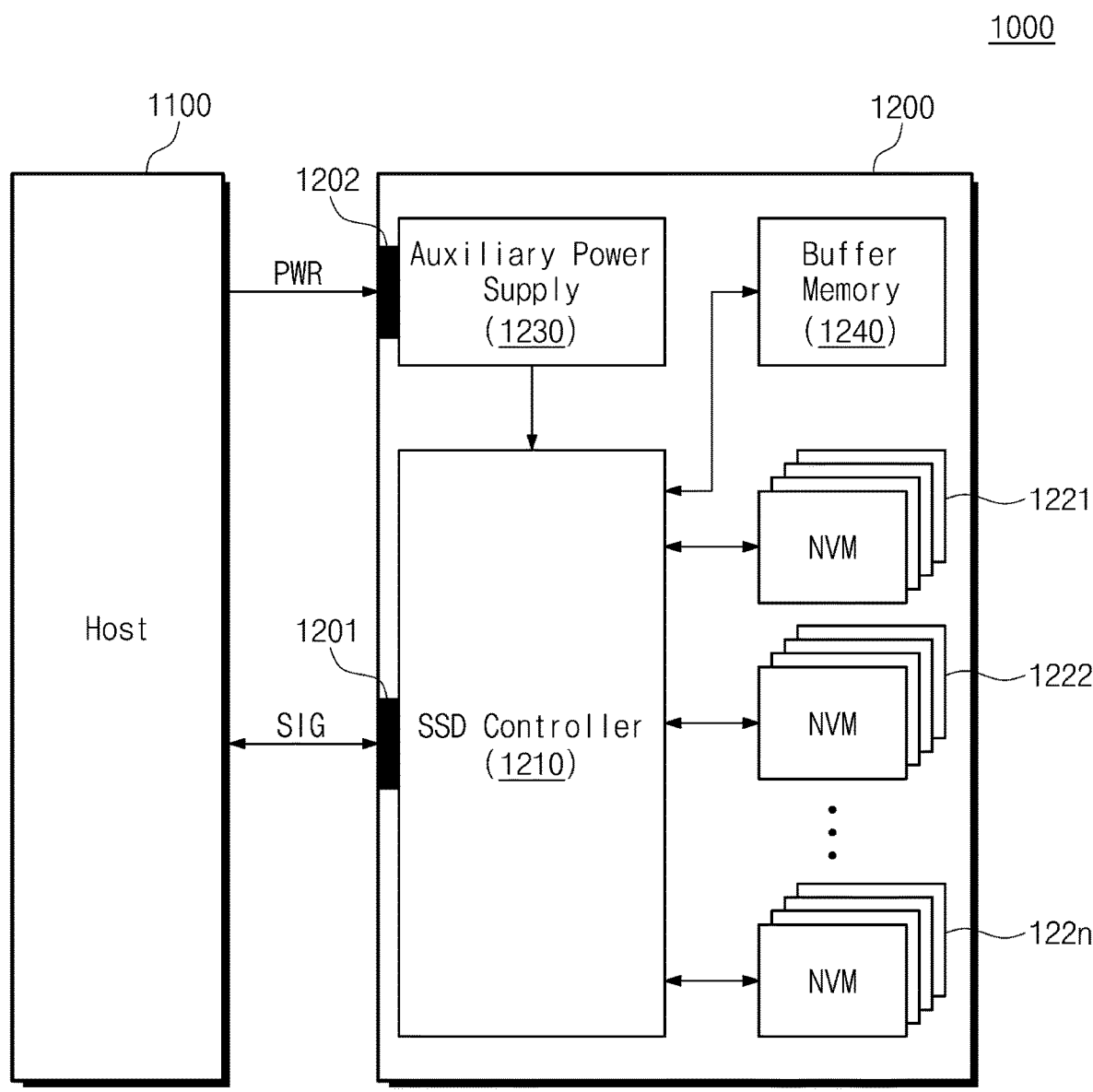
FIG. 21 illustrates a storage system to which a memory controller and a nonvolatile memory device according to an exemplary embodiment of the inventive concept are applied.

FIG. 21 illustrates a storage system to which a memory controller and a nonvolatile memory device according to an exemplary embodiment of the inventive concept are applied. A storage system 1000 may include a host 1100 and a storage device 1200.

The storage device 1200 exchanges a signal SIG with the host 1100 through a signal connector 1201 and is supplied with a power PWR through a power connector 1202. The storage device 1200 includes a solid state drive (SSD) controller 1210, a plurality of nonvolatile memories 1221 to 122n, an auxiliary power supply 1230, and a buffer memory 1240. Each of the plurality of nonvolatile memories 1221 to 122n may include a nonvolatile memory device described with reference to FIGS. 1 to 20. In other words, the nonvolatile memories 1221 to 122n may include the fast read page according to the bit ordering described with reference to FIGS. 1 to 20

The SSD controller 1210 may control the nonvolatile memories 1221 to 122n in response to the signal SIG received from the host 1100. The nonvolatile memories 1221 to 122n may operate under control of the SSD controller 1210. The auxiliary power supply 1230 is connected with the host 1100 through the power connector 1202. The auxiliary power supply 1230 may be charged by the power PWR supplied from the host 1100. When the power PWR is not smoothly supplied from the host 1100, the auxiliary power supply 1230 may power the storage device 1200. The SSD controller 1210 may be the memory controller 110 described with reference to FIGS. 1 to 20.

Figure 22:
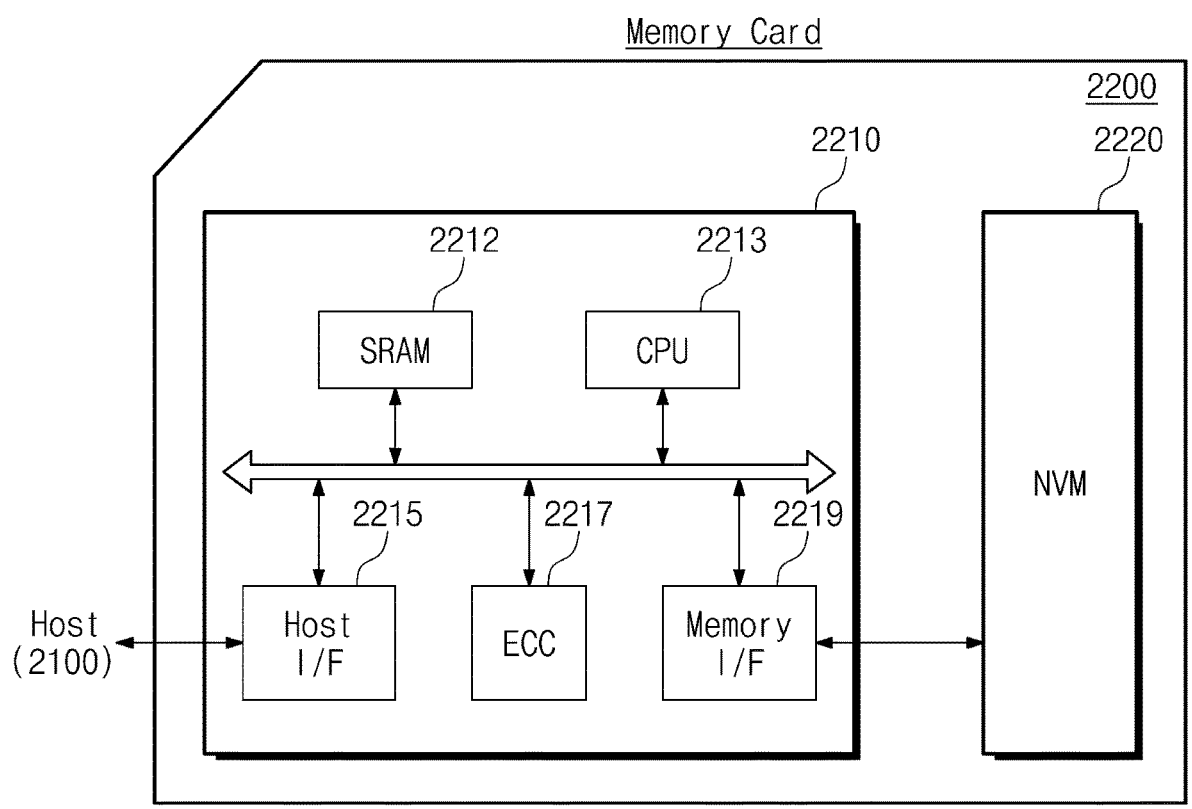
FIG. 22 illustrates a memory card to which a nonvolatile memory device according to an exemplary embodiment of the inventive concept is applied.

FIG. 22 illustrates a memory card to which a nonvolatile memory device according to an exemplary embodiment of the inventive concept is applied. Referring to FIG. 22, a memory card 2200 connected to a host 2100 includes a memory controller 2210 and a nonvolatile memory device 2220. The memory controller 2210 may include an SRAM 2212, a CPU 2213, a host interface 2215, an ECC engine 2217, and a memory interface 2219. The memory controller 2210 is configured to perform a read operation and a write operation on the nonvolatile memory device 2220 depending on the bit ordering described with reference to FIGS. 1 to 20. The nonvolatile memory device 2220 may be implemented with various nonvolatile memory devices such as a NAND flash memory device or a NOR flash memory device. For example, the memory controller 2210 and the nonvolatile memory device 2220 may be integrated in one semiconductor device to constitute a device such as a universal flash storage (UFS) card.

According to exemplary embodiments of the present inventive concept, a particular page of pages of memory cells connected to a selected word line is provided as a fast read page in which data are determined by one read voltage.

According to exemplary embodiments of the present inventive concept, among the pages of the memory cells connected to the selected word line, the remaining pages other than the fast read page are provided as normal read pages.

As a result, it is possible to secure a fast read speed and the reliability of data through the fast read page and to secure a large data capacity through the normal read pages.

While the inventive concept has been particularly shown and described with reference to exemplary embodiments thereof, it will be apparent to those of ordinary skill in the art that various changes and modifications may be made thereto without departing from the spirit and scope of the inventive concept as set forth in the following claims.

What is claimed is:

1. A nonvolatile memory device, comprising
    a memory cell array, the memory cell array including a plurality of cell strings, at least one of the cell strings including a plurality of memory cells stacked in a direction perpendicular to a surface of a substrate, at least one of the memory cells is a multi-level cell storing at least three bits; and
    a control logic circuit configured to control a page buffer to read a fast read page of the memory cells with one read voltage and at least two normal read pages of the memory cells with the same number of read voltages.

2. The nonvolatile memory device of claim 1, wherein only the one read voltage is used to read data of the fast read page.

3. The nonvolatile memory device of claim 2, wherein the data of the fast read page is frequently accessed.

4. The nonvolatile memory device of claim 3, wherein a read or program operation is performed when the data of the fast read page is accessed.

5. The nonvolatile memory device of claim 1, wherein at least three read voltages are used to read data of each of the at least two normal read pages.

6. The nonvolatile memory device of claim 1, wherein a bit ordering of the fast read page has only one bit transition.

7. The nonvolatile memory device of claim 1, wherein a bit ordering of each of the at least two normal read pages has more than one bit transition.

8. The nonvolatile memory device of claim 1, wherein the plurality of memory cells of the at least one cell string are disposed between a string select line and a ground select line.

9. The nonvolatile memory device of claim 8, wherein the at least one cell string includes a dummy memory cell disposed between one of the memory cells and a string selection transistor or between one of the memory cells and a ground select transistor.

10. The nonvolatile memory device of claim 1, wherein each of the memory cells is a charge trap flash transistor.

11. The nonvolatile memory device of claim 1, wherein the multi-level cell is a quad level cell, a penta level cell or a hexa level cell.

12. The nonvolatile memory device of claim 1, wherein the fast read page is one of a least significant bit page, a center significant bit page and a most significant bit page.

13. The nonvolatile memory device of claim 1, wherein the fast read page is a least significant bit page, a most significant bit page or one of a plurality of center significant bit pages.

14. The nonvolatile memory device of claim 1, wherein a first memory cell is programmed with single level cell (SLC) data and a second memory cell is programmed with triple level cell (TLC), quad level cell (QLC), or penta level cell (PLC) data.

15. The nonvolatile memory device of claim 14, wherein one of the TLC, QLC or PLC includes the fast read page and the normal read pages.

16. A storage system, comprising:
    a storage device that exchanges a signal with an external device, wherein the storage device includes a memory controller and a plurality of nonvolatile memories, wherein at least one of the memories includes:
    a memory cell array, the memory cell array including a plurality of memory cells stacked in a direction perpendicular to a surface of a substrate; and a control logic circuit configured to control a page buffer to read a fast read page of the memory cells with one read voltage and at least two normal read pages of the memory cells with the same number of read voltages.

17. The storage system of claim 16, wherein the fast read page stores data targeted for frequent reads.

18. The storage system of claim 16, wherein a bit ordering of the fast read page has only one bit transition, and a bit ordering of each of the at least two normal read pages has more than one bit transition.

19. The storage system of claim 16, wherein the memory cells include multi-level cells storing at least three bits.

20. The system of claim 16, further comprising a power supply configured to supply power to the memory controller.

21. A memory device, comprising:
a memory controller; and
a nonvolatile memory device connected to the memory controller, wherein the memory controller is configured to perform a read operation on the nonvolatile memory device such that a fast read page of the nonvolatile memory device is read with one read voltage and at least two normal read pages of the nonvolatile memory device are read with the same number of read voltages.

22. The memory device of claim 21, further comprising an interface for connecting to an external device.

23. The memory device of claim 21, wherein a read latency of the fast read page is shorter than a read latency of each of the normal read pages.

24. The memory device of claim 21, wherein data of the fast read page is more frequently accessed than data of each of the normal read pages.

25. The memory device of claim 21, wherein the memory controller includes a memory interface for data communication with the nonvolatile memory device.

* * * * *